(12) United States Patent
Liu et al.

(10) Patent No.: US 10,090,213 B2
(45) Date of Patent: *Oct. 2, 2018

(54) INTERPOSER TEST STRUCTURES AND METHODS

(71) Applicant: Taiwan Semiconductor Manufacturing Company, Ltd., Hsinchu (TW)

(72) Inventors: Tzuan-Horng Liu, Longtan Township (TW); Chen-Hua Yu, Hsinchu (TW); Hsien-Pin Hu, Zhubei (TW); Tzu-Yu Wang, Taipei (TW); Wei-Cheng Wu, Hsinchu (TW); Shang-Yun Hou, Jubei (TW); Shin-Puu Jeng, Po-Shan Village (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/449,683

(22) Filed: Mar. 3, 2017

(65) Prior Publication Data
US 2017/0178983 A1    Jun. 22, 2017

Related U.S. Application Data

(60) Continuation of application No. 14/846,605, filed on Sep. 4, 2015, now Pat. No. 9,589,857, which is a
(Continued)

(51) Int. Cl.
*H01L 21/48* (2006.01)
*H01L 21/66* (2006.01)
(Continued)

(52) U.S. Cl.
CPC .......... *H01L 22/32* (2013.01); *G01R 1/07378* (2013.01); *H01L 21/486* (2013.01);
(Continued)

(58) Field of Classification Search
None
See application file for complete search history.

(56) References Cited

U.S. PATENT DOCUMENTS

| 5,262,719 A | 11/1993 | Magdo |
| 9,128,123 B2 | 9/2015 | Liu et al. |

(Continued)

FOREIGN PATENT DOCUMENTS

| JP | H05218288 A | 8/1993 |
| JP | H07263590 A | 10/1995 |

(Continued)

OTHER PUBLICATIONS

Japanese Office Action and English Translation, Application No. 2012-123100, 4 pages.
(Continued)

*Primary Examiner* — Fernando L Toledo
*Assistant Examiner* — Valerie N Newton
(74) *Attorney, Agent, or Firm* — Slater Matsil, LLP

(57) ABSTRACT

An embodiment of the disclosure is a structure comprising an interposer. The interposer has a test structure extending along a periphery of the interposer, and at least a portion of the test structure is in a first redistribution element. The first redistribution element is on a first surface of a substrate of the interposer. The test structure is intermediate and electrically coupled to at least two probe pads.

20 Claims, 38 Drawing Sheets

Related U.S. Application Data division of application No. 13/198,223, filed on Aug. 4, 2011, now Pat. No. 9,128,123.

(60) Provisional application No. 61/492,989, filed on Jun. 3, 2011.

(51) Int. Cl.
*H01L 23/498* (2006.01)
*H01L 23/58* (2006.01)
*G01R 1/073* (2006.01)

(52) U.S. Cl.
CPC .... *H01L 21/4853* (2013.01); *H01L 23/49811* (2013.01); *H01L 23/49827* (2013.01); *H01L 23/49838* (2013.01); *H01L 23/585* (2013.01)

(56) References Cited

U.S. PATENT DOCUMENTS 9,589,857 B2 * 3/2017 Liu .................... H01L 22/34
2007/0290300 A1 * 12/2007 Kawakami ........ H01L 21/76898
257/621
2010/0009473 A1 1/2010 Mizoguchi
2010/0300733 A1 12/2010 Kim et al.
2010/0301009 A1 12/2010 Yoo et al.
2011/0084404 A1 4/2011 Yoko et al.

FOREIGN PATENT DOCUMENTS

| | | |
|---|---|---|
| JP | 2004311535 A | 11/2004 |
| JP | 2010045177 A | 2/2010 |
| KR | 20090017248 A | 2/2009 |
| KR | 10-2010-0129968 | 12/2010 |
| KR | 10-2010-0128524 | 6/2011 |
| WO | 2007129545 A1 | 11/2007 |

OTHER PUBLICATIONS

Korean Office Action and English Translation, dated Apr. 18, 2013, 8 apges.

* cited by examiner

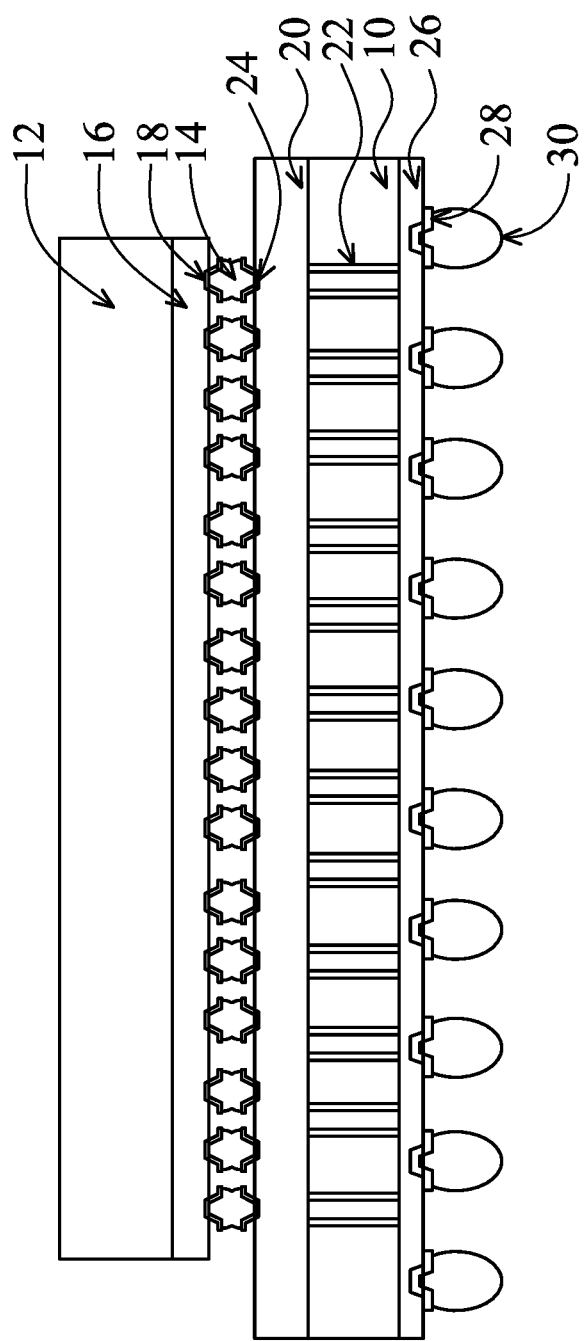

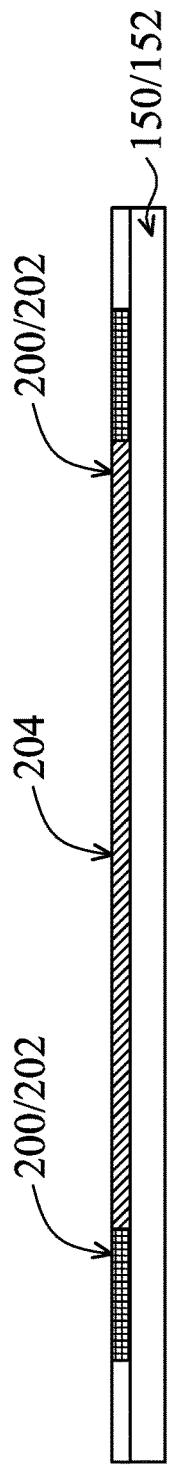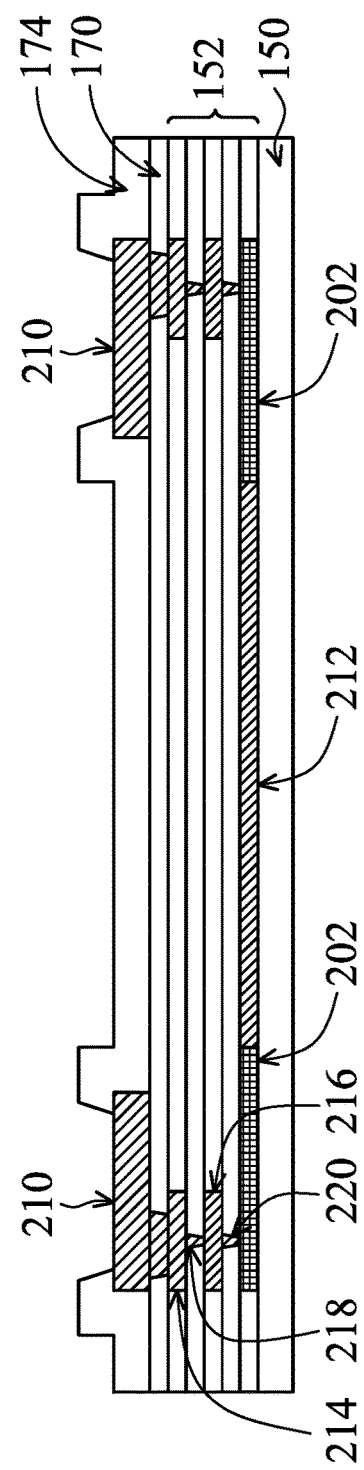

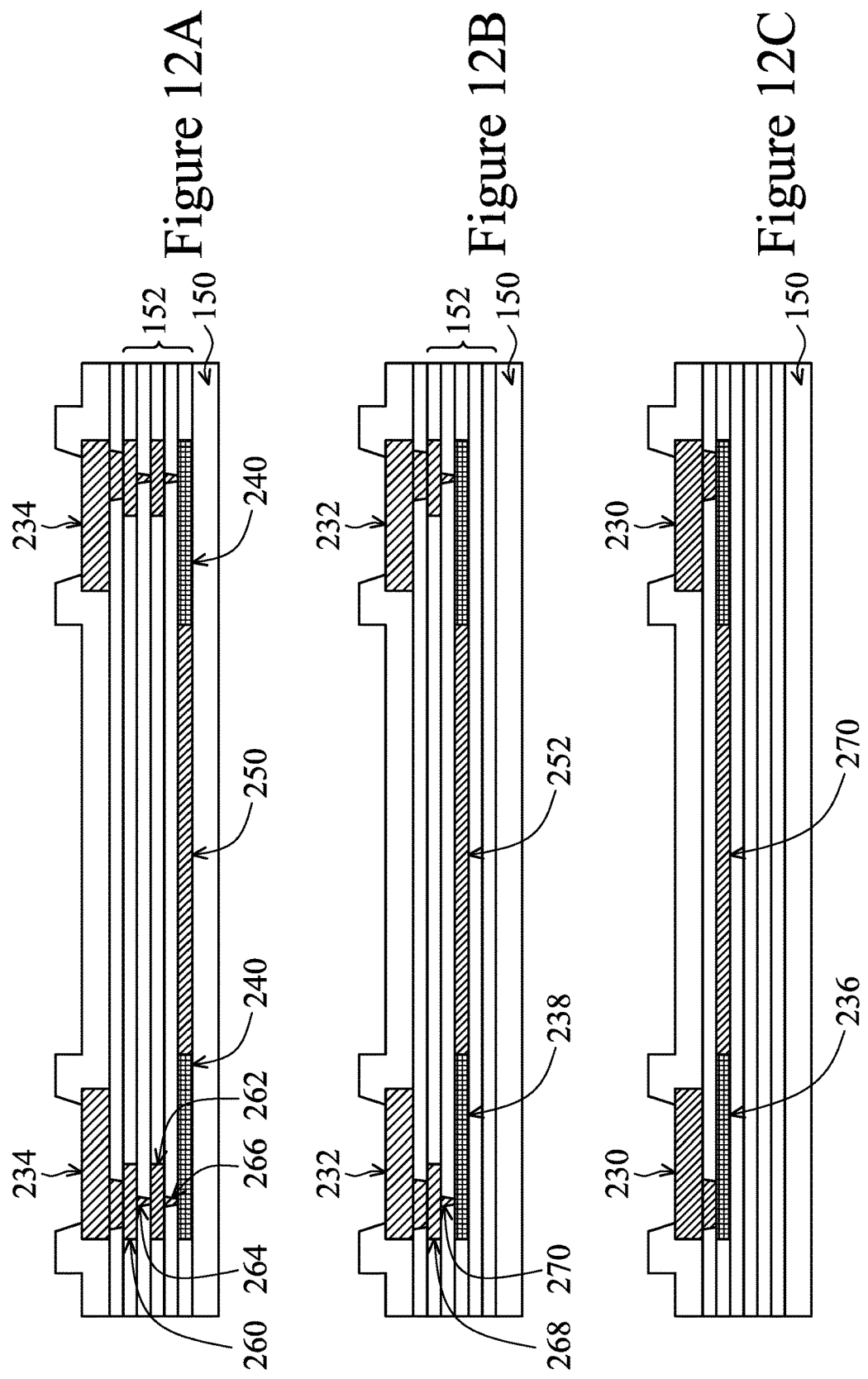

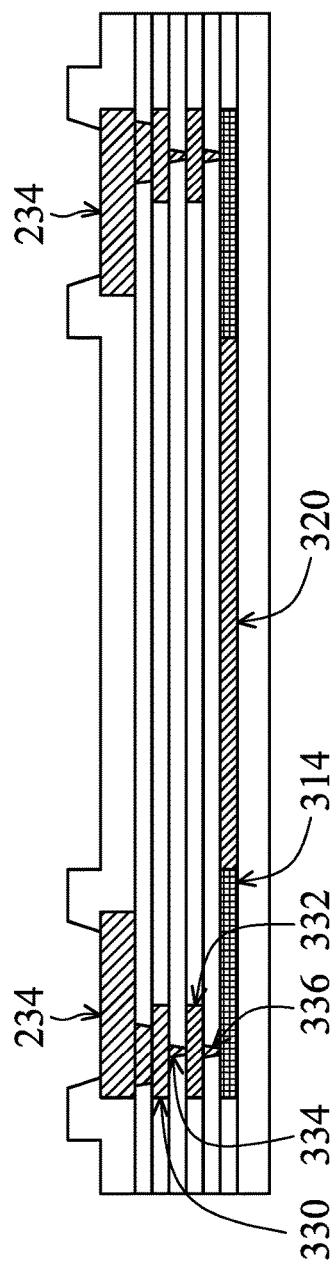
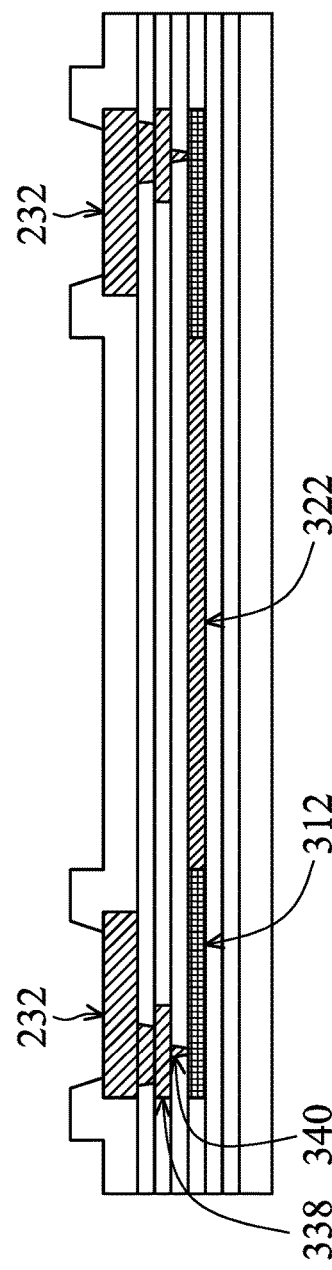
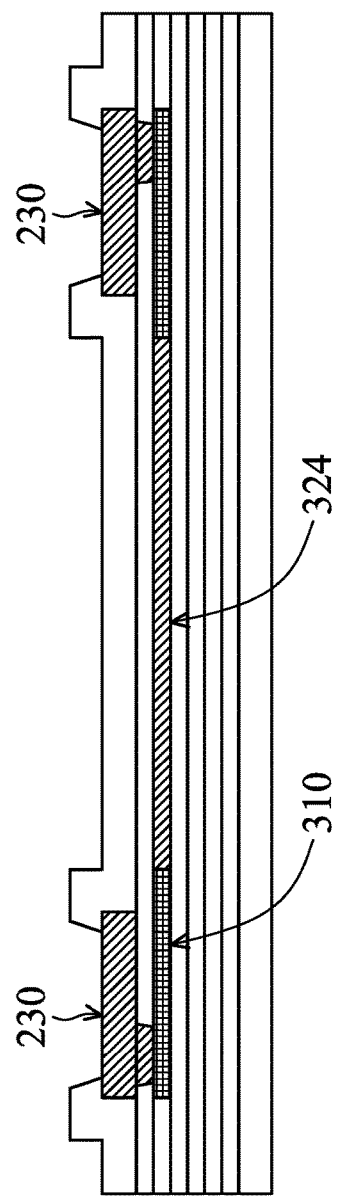

INTERPOSER TEST STRUCTURES AND METHODS

This application is a continuation of U.S. patent application Ser. No. 14/846,605, filed on Sep. 4, 2015, entitled "Interposer Test Structures and Methods," which is a divisional of U.S. patent application Ser. No. 13/198,223, now U.S. Pat. No. 9,128,123, filed on Aug. 4, 2011, entitled "Interposer Test Structures and Methods," which claims the benefit of U.S. Provisional Application No. 61/492,989, filed on Jun. 3, 2011, entitled "Interposer Test Structures and Methods," which applications are hereby incorporated herein by reference in their entireties.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Accordingly, interposers have been used to redistribute ball contact areas from that of the chip to a larger area of the interposer. Further, interposers have allowed for a three-dimensional (3D) package that includes multiple chips.

Despite the benefits of using an interposer to allow for a reduced size of the chip, using an interposer typically has drawbacks. Interposers generally introduce new sets of problems that go undetected until processing is completed. Thus, packages having faulty interposers may undergo processing that is unnecessary because a defect in earlier processing rendered the interposers unusable. Some of these problems generally include voids in a through substrate via (TSV, also known as a through-silicon via or a through semiconductor via), abnormal routing of a metallization layer after an etch process, a bump cold joint (open or short circuit), and a crack in an interposer ball.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 is a cross section view of an interposer with an integrated circuit die attached to a first side;

FIG. 8 is a cross section view of the structure of FIG. 7 according to the embodiment;

FIG. 10 is a cross section view of the structure of FIG. 9 according to the embodiment;

FIGS. 12A through 12C are cross section views of the structure of FIG. 11 according to the embodiment;

FIGS. 19A through 19C are cross section views of the structure of FIG. 18 according to the embodiment;

DETAILED DESCRIPTION OF ILLUSTRATIVE EMBODIMENTS

Figure 2A:
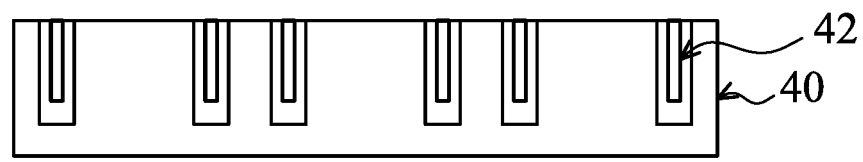
FIGS. 2A through 2H are a first method of forming the interposer with the integrated circuit die attached to the first side of FIG. 1.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an interposer and a die attached to an interposer. These embodiments include test structures for testing the reliability of processing for structures corresponding to the test structures during various steps of processing. While aspects of embodiments are discussed individually, a person having ordinary skill in the art will readily understand that embodiments may include many of the individually discussed aspects. Other embodiments may also be applied, however, to other packaging processes and packages.

FIG. 1 shows a cross section view of an interposer 10 with an integrated circuit die 12 attached to a first side of the interposer 10 via conductive bumps 14. The die 12 includes an interconnect element 16 that comprises one or more metallization layers. Die bond pads 18 are mechanically coupled to the die 12 and are electrically coupled to devices in the die 12 via the one or more metallization layers in the interconnect element 16. The conductive bumps 14 are mechanically and electrically coupled to the die bond pads 18 and may comprise, for example, microbumps, pillars, and/or columns having a diameter of about 5 microns to about 50 microns.

Interposer bump pads 24 are mechanically coupled to the interposer 10 and mechanically and electrically coupled to the conductive bumps 14. The interposer 10 comprises a redistribution layer (RDL) 20 comprising one or more metallization layer. The RDL 20 allows for a different pad configuration as well as larger conductive balls 30. The interposer bump pads 24 are electrically coupled to through substrate vias (TSVs, also known as through-silicon vias or through-semiconductor vias) 22 in the interposer 10 via the one or more metallization layers in the RDL 20. The TSVs 22 extend through a substrate of the interposer 10 from a front side of the substrate on which the RDL 20 is formed to a back side of the substrate. The interposer 10 comprises a passivation structure 26 which may include one or more metallization layers, such as a back side redistribution element. Ball pads 28 are mechanically coupled to the back side of the interposer 10 and are electrically coupled to the TSVs 22 directly and/or via the one or more metallization layers in the passivation structure 26. Conductive balls 30 are mechanically and electrically coupled to the ball pads 28. The conductive balls 30 may comprise a diameter of about 60 microns to about 120 microns. The conductive balls 30 provide external electrical connections from the die 12.

FIGS. 2A through 2H illustrate a first method of forming an interposer and a die attached to the interposer, such as the structure illustrated in FIG. 1. It should be appreciated that this order is provided for illustrative purposes, and that other sequences may be used. Referring first to FIG. 2A, a substrate 40 of an interposer is shown with TSVs 42 formed through a front side of the substrate 40. The substrate 40 generally comprises a material similar to the substrate used to form an integrated circuit die that will be attached to the interposer, such as silicon. While the substrate 40 may be formed of other materials, it is believed that using silicon substrates for the interposer may reduce stress because the coefficient of thermal expansion (CTE) mismatch between the silicon substrates and the silicon typically used for the dies is lower than with substrates formed of different materials.

The TSVs 42 are formed by forming recesses in the substrate 40 by, for example, etching, milling, laser techniques, a combination thereof, and/or the like. A thin barrier layer is conformally deposited over the front side of the substrate 40 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 40 by, for example, chemical mechanical polishing. Thus, the TSVs 42 comprise a conductive material and a thin barrier layer between the conductive material and the substrate 40.

Figure 2B:
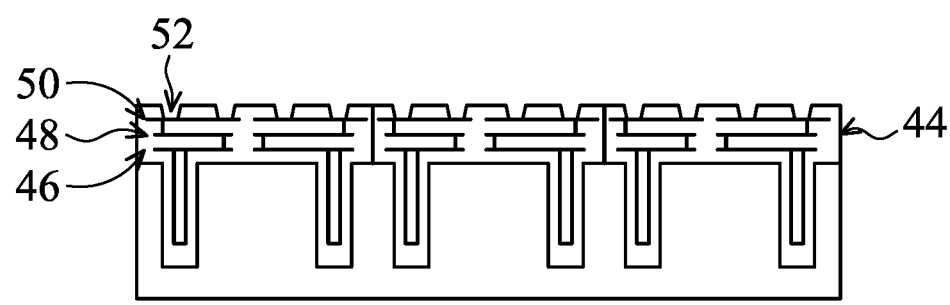

Front side processing continues in FIG. 2B with the formation of a RDL 44. The RDL 44 may comprise any number or combination of metallization layers, inter-metal dielectric (IMD) layers, vias, and passivation layers. The RDL 44 depicted in FIG. 2B comprises three metallization layers, such as a first metallization layer (M1) 46, a second metallization layer (M2) 48, and a third metallization layer (M3) 50, in IMD layers. Vias formed between metallization layers in the IMD layers. The metallization layers are formed by depositing an IMD layer, etching the metallization pattern of the layer in the IMD layer using, for example, acceptable photolithography techniques, depositing a conductive material for the metallization in the IMD, and removing any excess conductive material by, for example, CMP. The photolithography technique may include a single damascene process or a dual damascene process, particularly when vias are formed through an IMD to an underlying metallization layer.

The IMD layers can be an oxide dielectric, such as a borophosphosilicate glass (BPSG), or other dielectric material. The conductive material of the metallization layers may be, for example, copper, nickel, aluminum, copper aluminum, tungsten, titanium, combinations thereof, and/or the like. The metallization layers may include barrier layers between the conductive material and the IMD material, and other dielectric layers, such as etch stop layers made of, for example, silicon nitride, may be formed between the IMD layers.

After the formation of the top metallization layer, the third metallization layer 50 in FIG. 2B, one or more passivation layers are formed over the metallization layers. The passivation layer(s) may be a polyimide, a BPSG, silicon nitride (SiN), a combination thereof, and/or the like, and may be formed using a spin-on technique, CVD, ALD, PVD, a combination thereof, and/or the like. Openings 52 are formed through the passivation layers to expose the top metallization layer, the third metallization layer 50 in FIG. 2B, for the formation of bump pads on the top metallization layer. The openings 52 may be formed using, for example, acceptable photolithography and etching techniques.

Figure 2C:
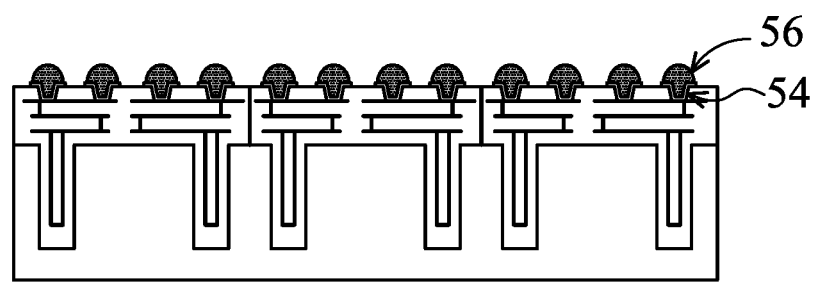

Referring to FIG. 2C, bump bond pads 54 are formed through the openings 52 on the top metallization layer, and conductive bumps 56 are formed on the bump bond pads 54. The bump bond pads 54 may be formed by depositing a conductive material in the openings 52 and patterning the conductive material into the bump bond pads 54. The conductive material may comprise copper, silver, tin, titanium, tungsten, a combination thereof, and/or the like, and may be deposited by PVD, CVD, ALD, a combination thereof, and/or the like. The patterning of the bump bond pads 54 may be by acceptable photolithography and etching techniques. The conductive bumps 56 are formed on the bump bond pads 54 by electrochemical plating (ECP), and/or the like, and may comprise copper, tin, nickel, a combination thereof, and/or the like.

Figure 2D:
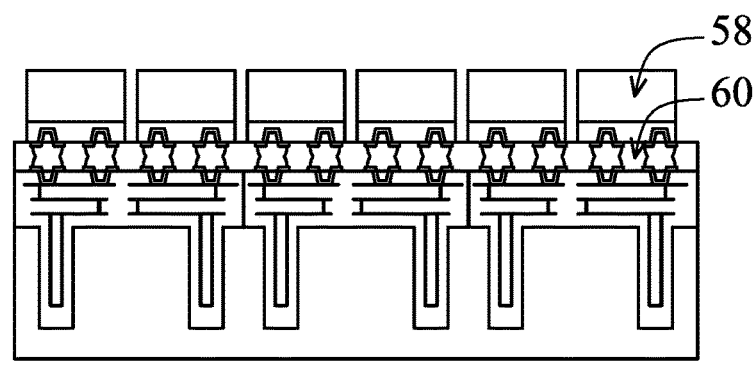
Figure 2E:
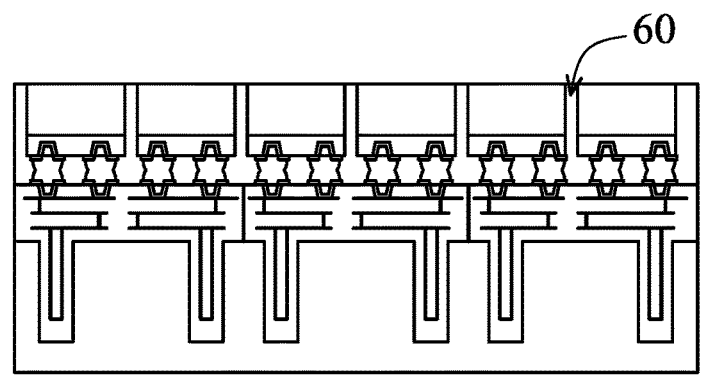

In FIG. 2D, integrated circuit dies 58 are attached by the conductive bumps 56, and an underfill material 60 is dispensed between the dies 58 and the interposer, for example, the top passivation layer. The dies 58 may be known good dies attached using a pick-and-place tool, and the conductive bumps 56 may be reflowed before the underfill material 60 is dispensed. The underfill material 60 may be a liquid epoxy, deformable gel, silicon rubber, a combination thereof, and/or the like dispensed using acceptable dispensing equipment. In FIG. 2E, after the underfill material 60 is cured, the dies 58 are encapsulated by applying a molding compound 62 and using compression molding, for example.

Figure 2F:
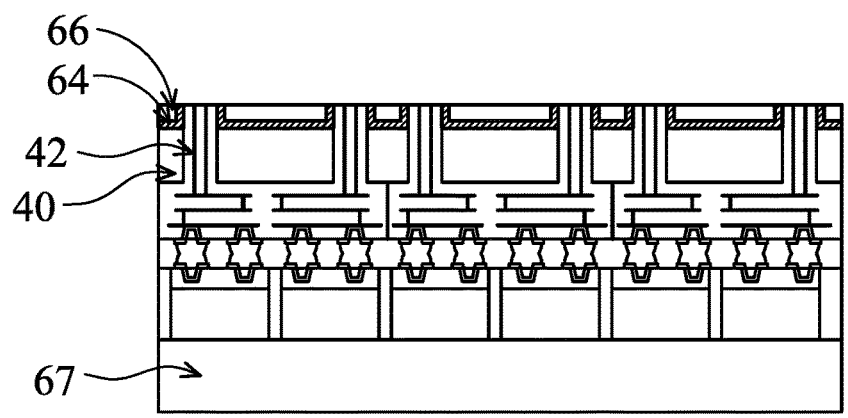

Back side processing of the substrate 40 is depicted as beginning in FIG. 2F. The assembly of FIG. 2E is attached to a carrier substrate 67 during the back side processing. The carrier substrate 67 may be attached to the dies 58 and/or the molding compound 62 using an adhesive. Generally, the carrier substrate provides temporary mechanical and structural support during subsequent processing steps. In this manner, damage to an interposer is reduced or prevented. The carrier substrate may comprise, for example, glass, silicon oxide, aluminum oxide, a combination thereof, and/ or the like. The adhesive may be any suitable adhesive, such as ultraviolet (UV) glue, which loses its adhesive property when exposed to UV lights.

In FIG. 2F, TSVs 42 protrude from the back side of the substrate 40 by thinning the substrate 40. The thinning process may be performed using an etching process and/or a planarization process, such as a chemical mechanical polishing (CMP) process. For example, initially a planarizing process, such as a CMP, may be performed to initially expose the barrier layer of the TSVs 42. Thereafter, one or more wet etching processes having a high etch-rate selectivity between the material of the barrier layer and the substrate 40 may be performed, thereby leaving the TSVs 42 protruding from the back side of the substrate 40. The etch process may also be, for example, a dry etch process. One or more dielectric layers, such as dielectric layer 64 and 66 shown in FIG. 2F, are deposited over the back side of the substrate 40. The dielectric layers 64 and 66 may be, for example, silicon oxide, silicon nitride, silicon oxynitride, a combination thereof, and/or the like. The back side is then planarized, for example, by CMP, such that the TSVs 42 are exposed on the back side.

Figure 2G:
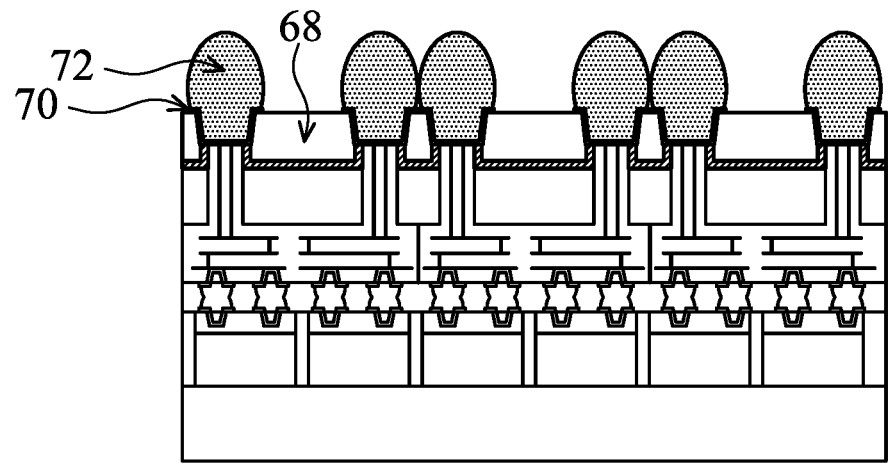

FIG. 2G shows the formation of a passivation layer 68, ball bond pads 70, and conductive balls 72. The passivation layer 68 is formed on the back side over the dielectric layers 64 and 66, and may be, for example, a polyimide, BPSG, polybenzoxazole (PBO), a combination thereof, and/or the like, formed by a spin-on technique, CVD, ALD, a combination thereof, and/or the like. Openings are formed through the passivation layer 68 to expose, for example, the TSVs 42, for the formation of ball bond pads 70. The openings may be formed using, for example, acceptable photolithography and etching techniques. The ball bond pads 70 may be formed by depositing a conductive material, such as a metal, for example, one or more layers of chrome, a chrome-copper alloy, copper, gold, titanium, titanium tungsten, nickel, combinations thereof, or the like, in the openings and patterning the conductive material into the ball bond pads 70. The conductive material may be deposited by ECP and/or the like, and the patterning may be by acceptable photolithography and etching techniques. The conductive balls 72 are formed on the ball bond pads 70 by ECP and/or the like, and may comprise copper, tin, eutectic solder, lead free solder, nickel, a combination thereof, and/or the like.

It should be noted that FIG. 2G depicts the ball bond pads 70 as directly coupled to the TSVs 42; however, one or more metallization layers and IMD layers may be formed on the back side of the substrate 40 to electrically couple the ball bond pads 70 to the TSVs 42. The back side metallization layers may be formed of any suitable conductive material, such as copper, copper alloys, aluminum, silver, gold, combinations thereof; and/or the like, formed by any suitable technique, such as ECP, electroless plating, other deposition methods such as sputtering, printing, and CVD, PVD, a combination thereof, and/or the like.

Figure 2H:
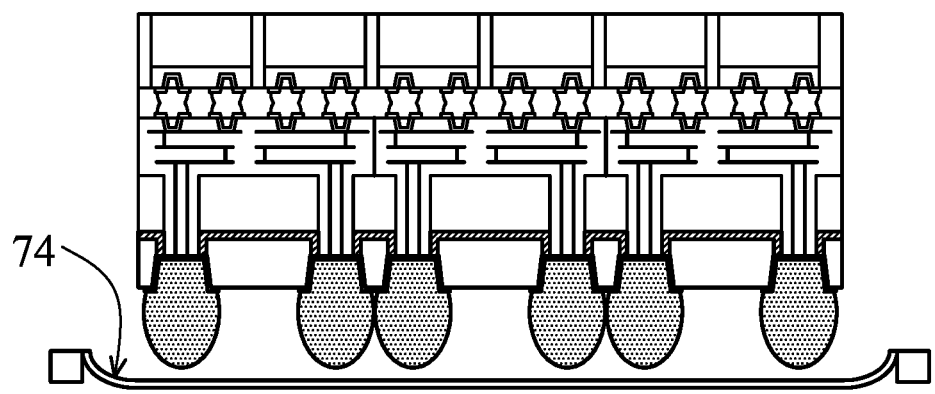

The assembly is then attached to a dicing frame 74, with the conductive balls 72 adjoining the dicing frame 74, and the carrier substrate 67 is removed, as shown in FIG. 2H. The assembly is then diced into individual packages with an interposer and any number of dies, such as the package shown in FIG. 1.

Figure 3A:
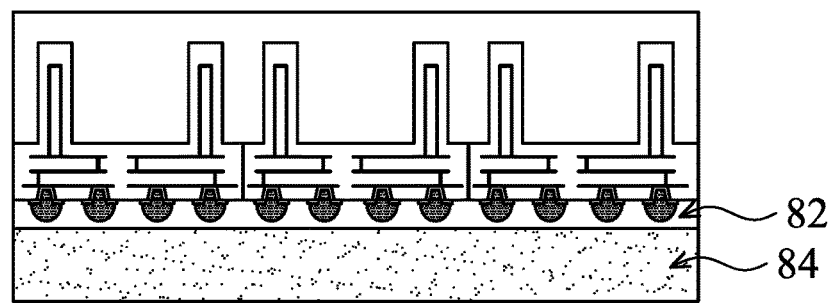
FIGS. 3A through 3F are a second method of forming the interposer with the integrated circuit die attached to the first side of FIG. 1.

FIGS. 3A through 3F illustrate a second method of forming an interposer and a die attached to the interposer, such as the structure illustrated in FIG. 1. It should be appreciated that this order is provided for illustrative purposes, and that other sequences may be used. In this method, an assembly is processed through FIG. 2C as previously discussed. The front side of the assembly in FIG. 2C is then attached to a carrier substrate 80 by an adhesive 82, as shown in FIG. 3A. The carrier substrate 80 may comprise, for example, glass, silicon oxide, aluminum oxide, a combination thereof, and/or the like. The adhesive 82 may be any suitable adhesive, such as UV glue.

Figure 3B:
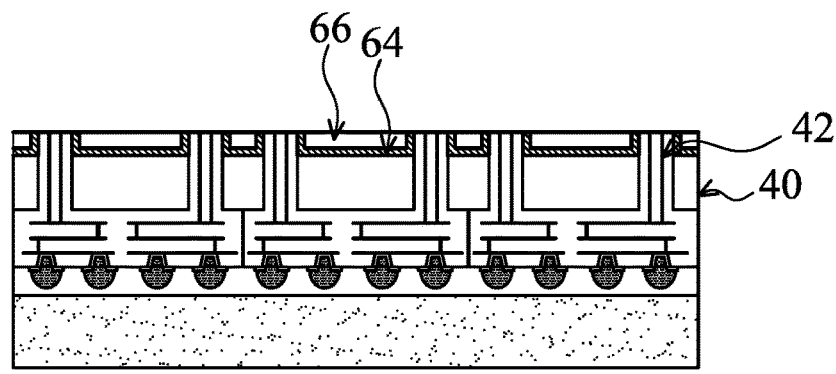
Figure 3C:
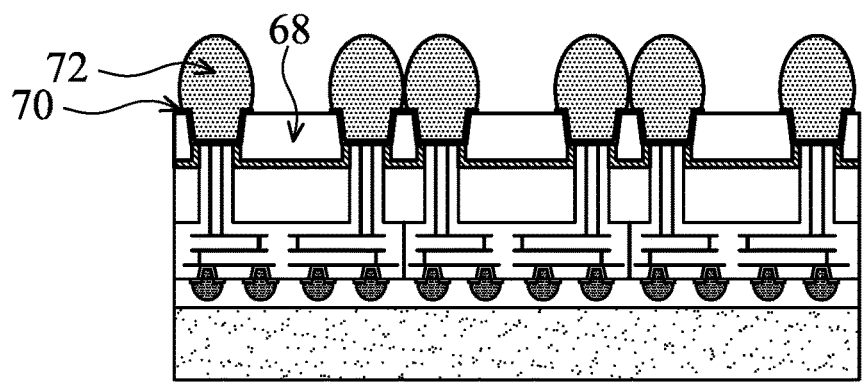

Back side processing begins as shown in FIG. 3B. In FIG. 3B, TSVs 42 protrude from the back side of the substrate 40 by thinning the substrate 40. Causing the TSVs 42 to protrude and the formation of the dielectric layers is similar to or the same as what was discussed with respect to FIG. 2F. In FIG. 3C, a passivation layer 68, ball bond pads 70, and conductive balls 72 are formed. The steps for forming these components are similar to or the same as what was discussed with respect to FIG. 2G.

Figure 3D:
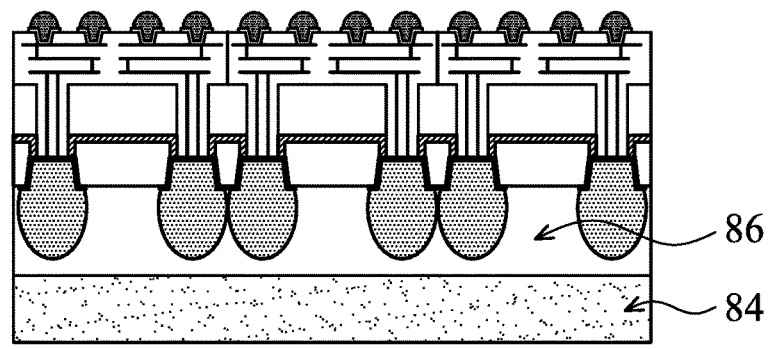

In FIG. 3D, the assembly of FIG. 3C is removed from the carrier substrate 80, for example, by exposing the adhesive 82 to UV radiation, and the assembly is attached to another carrier substrate 84 by an adhesive 86. The back side of the assembly is facing the carrier substrate 84. The carrier substrate 84 may comprise, for example, glass, silicon oxide, aluminum oxide, a combination thereof, and/or the like. The adhesive 86 may be any suitable adhesive, such as UV glue.

Figure 3E:
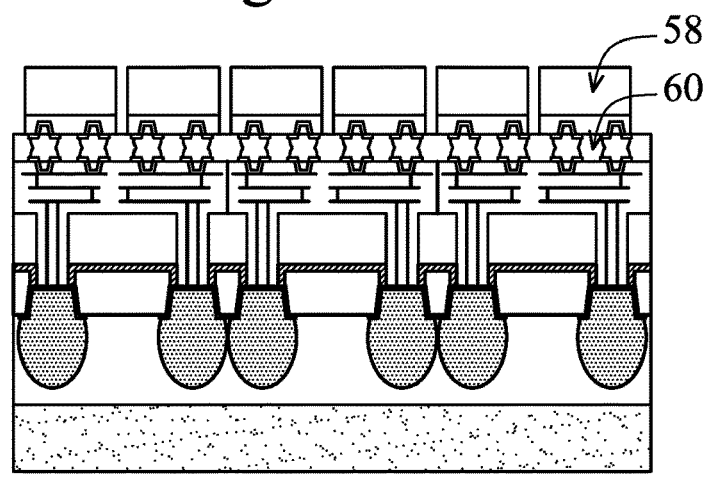
Figure 3F:
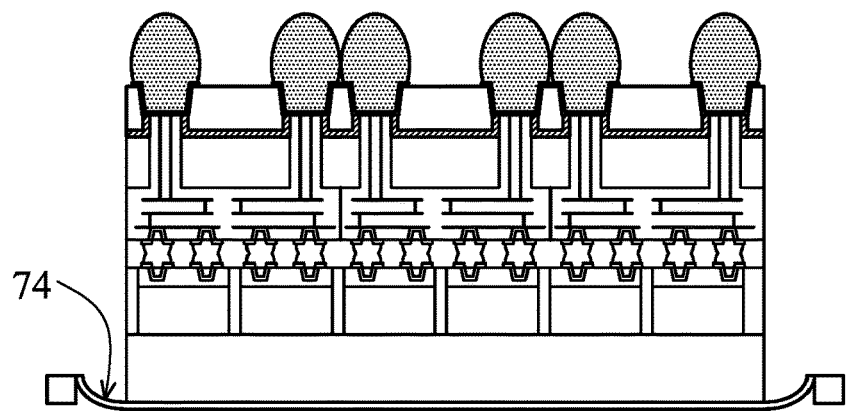

In FIG. 3E, similar to FIG. 2D, integrated circuit dies 58 are attached to the front side of the assembly, and an underfill material 60 is dispensed between the dies 58 and the interposer, for example, the top passivation layer. In FIG. 3F, the carrier substrate 84 is removed from the assembly, for example, by exposing the adhesive 86 to UV radiation. The assembly is then attached to a dicing frame 74 with the back side facing away from the dicing frame 74, for example, with the conductive balls 72 facing away from the dicing frame 74. The assembly is then diced into individual packages with an interposer and any number of dies, such as the package shown in FIG. 1.

Figure 4:
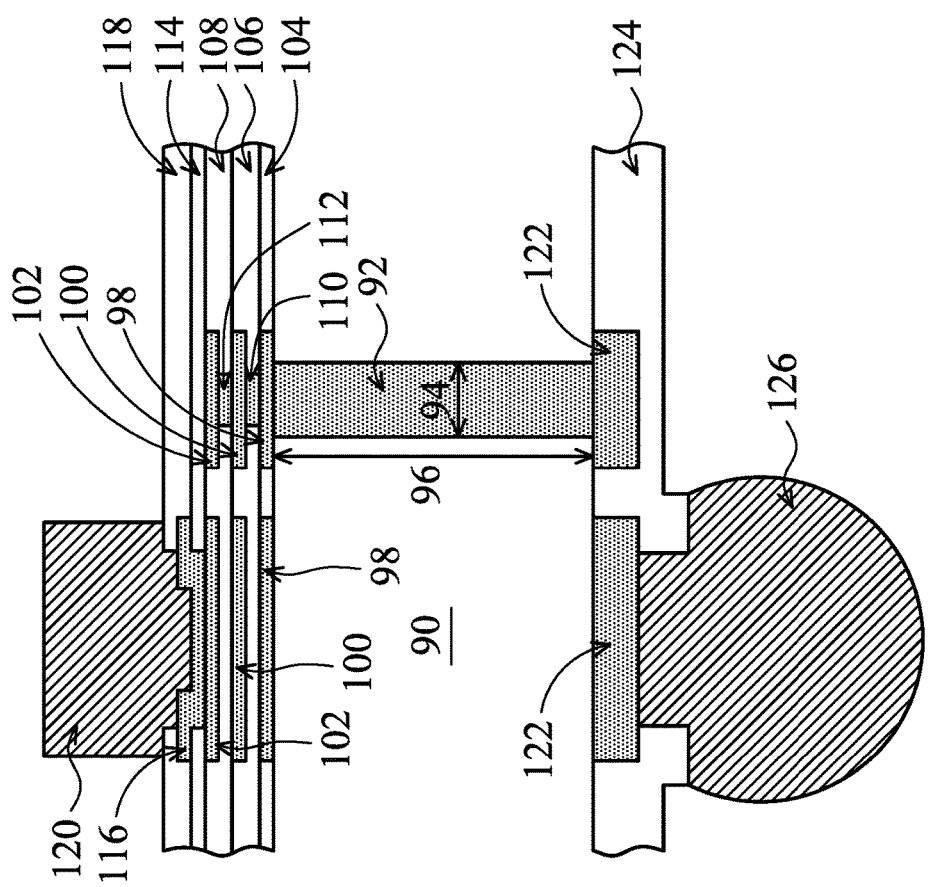
FIG. 4 is a detailed cross section view of a portion of an interposer.

FIG. 4 is a detailed cross section view of a portion of an interposer. The interposer comprises a substrate 90 having a TSV 92. The substrate is, for example, a silicon substrate. The TSV 92 extends from a front side surface to a back side surface of the substrate 90 by a depth 96. The TSV 92 has a width 94, which may also be a diameter. The depth 96 may be between approximately 50 micrometers to approximately 200 micrometers, and the width 94 may be between about 3 micrometers to about 15 micrometers. The TSV 92 may have an aspect ratio that is between about 6 to about 18.

The interposer further comprises, formed on the front side surface, a first metallization layer 98, a second metallization layer 100, and a third metallization layer 102 formed in a first IMD layer 104, a second IMD layer 106, and a third. IMD layer 108, respectively. A first via 110 electrically couples a portion of the first metallization layer 98 to a portion of the second metallization layer 100, and a second via 112 electrically couples a portion of the second metallization layer 100 to a portion of the third metallization layer 102.

A first passivation layer 114 is formed over the third metallization layer 102 and the third IMD layer 108 and is patterned to expose a portion of the third metallization layer 102. A bond pad 116 is formed on the exposed portion of the third metallization layer 102 and includes a flange portion over the first passivation layer 114. A second passivation layer 118 is formed over the first passivation layer 114 and the flange portion of the bond pad 116. The bond pad 116 is exposed through the second passivation layer 118. A conductive bump 120 is on the bond pad 116 and has a diameter of, for example, approximately 25 micrometers.

The interposer also comprises, formed on the back side surface, a back side metallization layer 122. A back side passivation layer 124 is formed over the back side metallization layer 122 and is patterned to expose a portion of the back side metallization layer 122. A conductive ball 126 is formed on the exposed portion of the back side metallization layer 122 and has a diameter of, for example, about 100 micrometers.

Figure 5B:
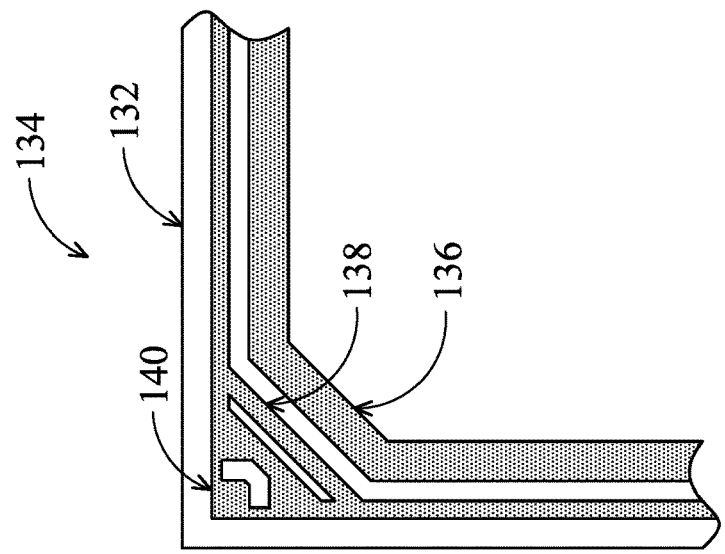
FIGS. 5A and 5B are a layout view of a seal ring pattern of a metallization layer on an interposer.
Figure 5A:
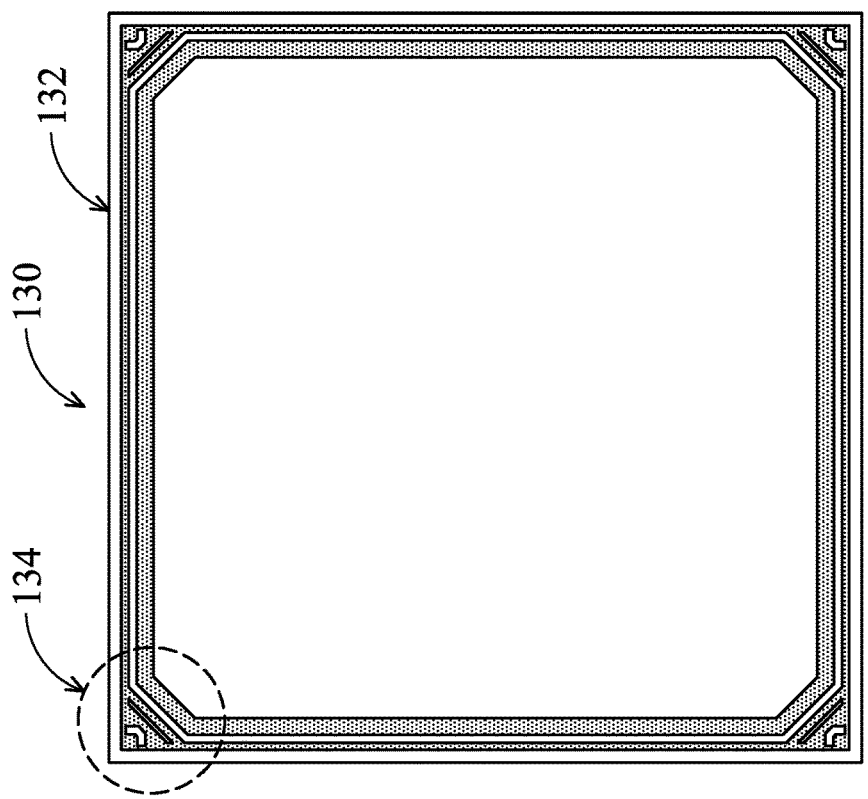

FIGS. 5A and 5B illustrate a layout view of a seal ring pattern 30 of a metallization layer(s) on an interposer. The seal ring pattern 130 may be for one metallization layer, all metallization layers, or any combination of metallization layers formed, for example, on a front side of the interposer.

FIG. 5A depicts an edge 132 of the interposer and identifies a view 134 of a corner that is expanded in FIG. 5B. FIG. 5B illustrates the pattern of an inner seal ring pattern 136 and an outer seal ring pattern 138. Each of the inner seal ring pattern 136 and the outer seal ring pattern 138 extends along the edge 132 some distance interior to the edge 132 except extends at forty-five degrees from the edge 132 near a corner. A corner pattern 140 extends into the corner exterior to where the outer seal ring pattern 138 extends at the forty-five degree angle, and the corner pattern 140 is coupled to the outer seal ring pattern 138. The corner pattern 140 may also be referred to as a corner stress relief (CSR) area.

Figure 6:
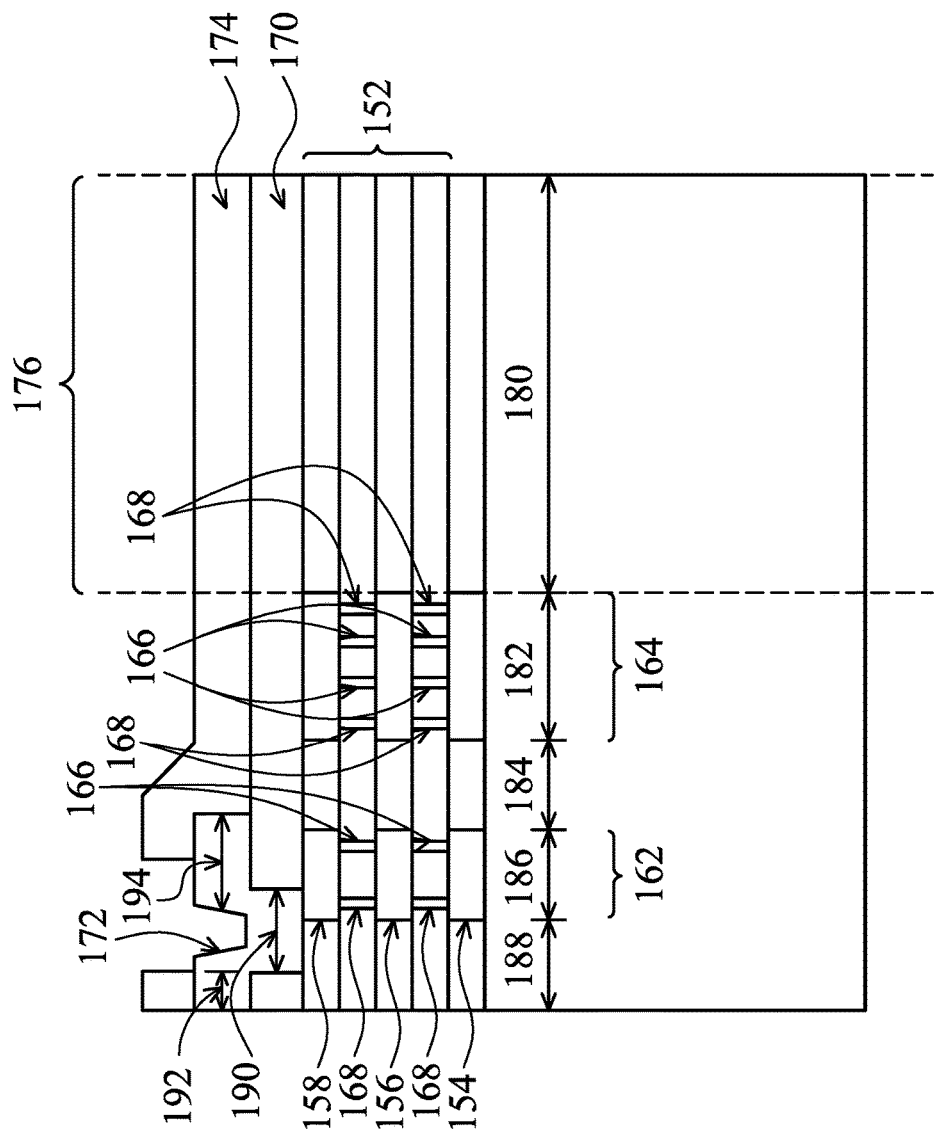
FIG. 6 is a cross section view of seal rings along a periphery of the interposer of FIGS. 5A and 5B.

FIG. 6 illustrates a cross section view of seal rings along a periphery of an interposer. The interposer includes a substrate 150 with IMD layers 152 formed on a front side surface of the substrate 150. In the IMD layers 152 are a first metallization layer 154, a second metallization layer 156, and a third metallization layer 158 formed of, for example, copper, although any of the other materials discussed previously may be used. Each of the metallization layers 154, 156, and 158 includes a portion in an outer seal ring 162 and an inner seal ring 164. The portions of the metallization layers 154, 156, and 158 in the outer seal ring 162 include the outer seal ring pattern 138 and the corner pattern 140 shown in FIGS. 5A and 5B. Similarly, the portions of the metallization layers 154, 156, and 158 in the inner seal ring 164 include the inner seal ring pattern 136 shown in FIGS. 5A and 5B. Discrete vias 166 and via bars 168 electrically couple the metallization layers 154, 156, and 158 together. Via bars 168 generally extend along the edge 132 similar to the outer seal ring pattern 138 or the inner seal ring pattern 136.

A first passivation layer 170 is formed over the top IMD layer of the IMD layers 152 and the third metallization layer 158. The portion of the third metallization layer 158 in the outer seal ring 162 is exposed by an opening, and a pad 172 is formed in the opening electrically coupled to the portion of the third metallization layer 158 in the outer seal ring 162. The pad 172 comprises, for example, aluminum or copper aluminum, although other materials previously discussed may be used. A flange portion of the pad 172 is over the first passivation layer 170. A second passivation layer 174 is over the first passivation layer 170 and part of the flange portion of the pad 172. The pad 172 is exposed through the second passivation layer 174. It should be noted that in some structures, the pad 172 may not be present, and various openings through the first passivation layer 170 and the second passivation layer 174 may or may not be present.

The structures in the interposer may have various dimensions, which may further be modified depending on the technology node used. Dimensions for the interposer are exemplary for a 65 nanometer technology node and do not limit the scope of embodiments. FIG. 6 further illustrates an isolation area 176 interior to the interposer from the inner seal ring 164. The isolation area may have a width 180 of, for example, about 10 micrometers from the inner edge of the inner seal ring 164 extending inwardly towards the center of the interposer. The inner seal ring 164 may have a width 182 of, for example, about 3.5 micrometers. A distance 184 between an outer edge of the inner seal ring 164 and an inner edge of the outer seal ring 162 may be, for example, about 2.5 micrometers. The outer seal ring 162 may have a width 186 of, for example, about 2 micrometers. A distance 188 from the outer edge of the outer seal ring 162 to the edge 132 of the interposer may be, for example, about 2 micrometers. The pad 172 may have a width 190 between sidewalls of the first passivation layer 170 of, for example, about 2 micrometers. A flange portion of the pad 172 may have a width 192 adjacent the edge 132 of, for example, about 1 micrometer, and an opposite width 194 of, for example, about 2 micrometers.

Figure 7:
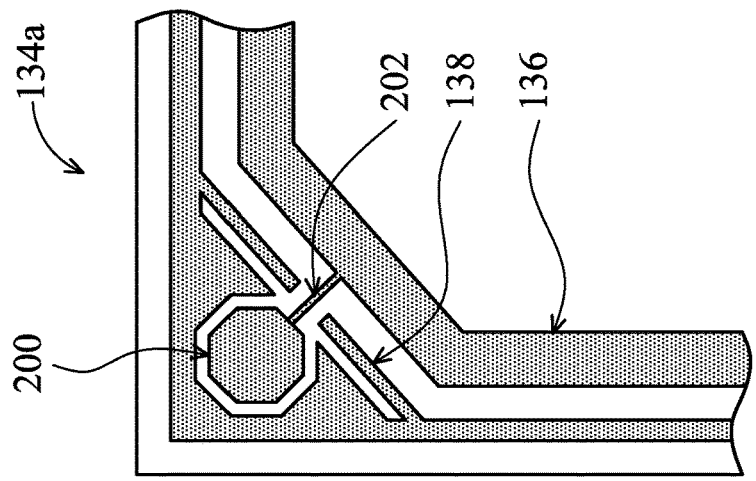
FIG. 7 is a layout view of a seal ring pattern in a metallization layer according to an embodiment.

FIG. 7 illustrates a view 134a of a metallization layer, which is a modification of the seal ring pattern of FIGS. 5A and 5B. A probe pad 200 is formed in the corner and is connected by a line 202 to the inner seal ring pattern 136. The outer seal ring pattern 138 is discontinuous where the line 202 intersects the outer seal ring pattern 138. Similar probe pads and lines may be formed in each corner.

FIG. 8 illustrates a cross section view of the structure of FIG. 7. It should be noted that FIG. 8 is a simplified view because the connections of FIG. 7 generally do not align in a single cross section plane. FIG. 8 shows the structure before processing is completed, such as after forming an appropriate metallization layer and/or IMD layer as discussed with regard to FIG. 2B but before the formation of an overlying IMD layer or passivation layer. FIG. 8 depicts a segment under test 204, which is, for example, a portion of one of the metallization layers 154, 156, and 158 in the inner seal ring 164 of FIG. 6 and a segment of the inner seal ring pattern 136 in FIG. 7, with a combination probe pad 200 and connection 202 at opposing ends of the segment under test 204. The segment under test 204 may be in any of the metallization layers, and therefore, may be over only the substrate 150 or over any of the IMD layers 152 (depicted as "150/152"). The segment under test 204 is electrically isolated from a metallization layer that may underlie the segment under test 204.

After forming the particular metallization layer in which the segment under test 204 is formed and before forming an immediately overlying IMD layer or passivation layer, the segment under test 204 of the inner seal ring pattern 136 is tested by probing the probe pads 200 at respective ends of the segment. By applying a signal at one probe pad 200, it can be determined whether the segment under test 204 has a void or discontinuity in the metallization of the segment by sensing a signal at another probe pad 200 at an opposite end of the segment under test 204. Typically, the segment under test 204 will be electrically isolated from or independent of other electrical paths. For example, the inner seal ring pattern 136 in which the segment under test 204 is formed typically will not form an enclosed loop because doing so will allow the test signal to travel around the loop between the probe pads 200 when the segment under test 204 is open, e.g., has a void or discontinuity. Further, the segment under test 204 generally will not be coupled to underlying metallization to avoid an alternate path for the test signal. After testing, a subsequent IMD layer and/or passivation layer may be formed. If a metallization layer is formed over the metallization layer in which the segment under test 204 is formed, the overlying metallization layer may be electrically coupled to the segment under s 204 because the testing occurred before the formation of the overlying metallization layer.

Figure 9:
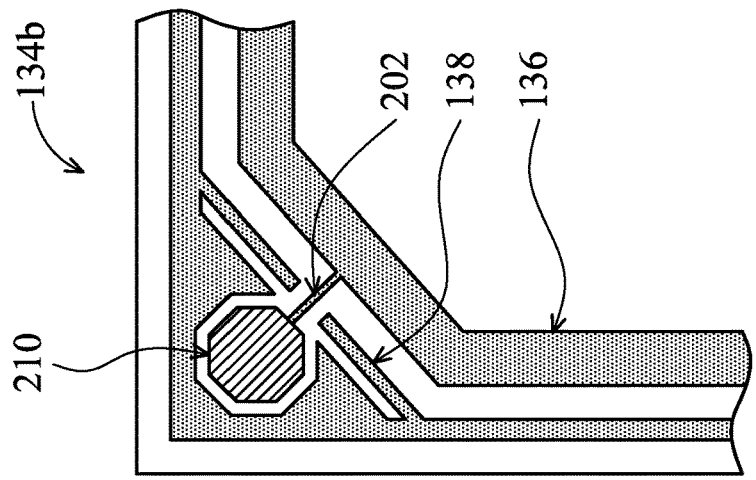
FIG. 9 is a layout view of a seal ring pattern in a metallization layer according to an embodiment.

FIG. 9 illustrates another view 134b with a metallization layer overlaid with a probe pad 210. FIG. 9 is a modification of the seal ring pattern of FIGS. 5A and 5B. The probe pad 210 is formed, for example, contemporaneously with bump bond pads, such as bump bond pads 54 in FIG. 2C. The probe pad 210 is formed in the corner and is electrically coupled through an interconnect structure (not shown in FIG. 9) and a line 202 to the inner seal ring pattern 136. The outer seal ring pattern 138 is discontinuous where the line 202 intersects the outer seal ring pattern 138. Similar probe pads, interconnect structures, and lines may be formed in each corner.

FIG. 10 illustrates a cross section view of the structure of FIG. 9. It should be noted that FIG. 10 is a simplified view because the connections of FIG. 9 generally do not align in a single cross section plane. FIG. 10 shows the structure after bump bond pads are formed, such as after forming bump bond pads 54 as discussed with regard to FIG. 2C, but before subsequent processing such as discussed with regard to FIGS. 2D or 3A. FIG. 10 depicts a segment under test 212, which is, in this example, a portion of the first metallization layer 154 in the inner seal ring 164 of FIG. 6 and a segment of the inner seal ring pattern 136 in FIG. 9. At each of opposing ends of the segment under test 212 is an interconnect structure electrically coupling the probe pad 210 to the segment under test 212. Each of the interconnect structures comprises a landing portion 214 of the third metallization layer 158, a landing portion 216 of the second metallization layer 156, a via 218 connecting the landing portions 214 and 216, and a via 220 connecting the landing portion 216 to a combination of a landing portion and line 202 of the first metallization layer 154.

Although the segment under test 212 is depicted in FIG. 10 in the first metallization layer 154, the segment under test 212 may be in any of the metallization layers. A person having ordinary skill in the art will readily understand the modifications to the interconnect structures and metallization patterns to form these different structures. It is worth noting that although no portion of another metallization layer (besides what is shown in the interconnect structures) is depicted in the cross section of FIG. 10, portions of other metallization layers may overlie or underlie the segment under test 212. The segment under test 212 is typically electrically isolated from portions of a metallization layer that may underlie or overlie the segment under test 212, with the exception of the portions of the interconnect structures.

After completing processing through the formation of bump bond pads, such as bump bond pads 54 as discussed with regard to FIG. 2C, but before subsequent processing such as discussed with regard to FIGS. 2D or 3A, the segment under test 212 of the inner seal ring pattern 136 is tested by probing the probe pads 210 at respective ends of the segment. By applying a signal at one probe pad 210, it can be determined whether the segment under test 212 has a void or discontinuity in the metallization of the segment by sensing a signal at another probe pad 210 at an opposite end of the segment under test 212. Typically, the segment under test 212 will be electrically isolated from or independent of other electrical paths. For example, similar to above, the inner seal ring pattern 136, in which the segment under test 212 is formed, typically will not form an enclosed loop, and the segment under test 212 generally will not be coupled to underlying metallization to avoid an alternate path for the test signal.

Figure 11:
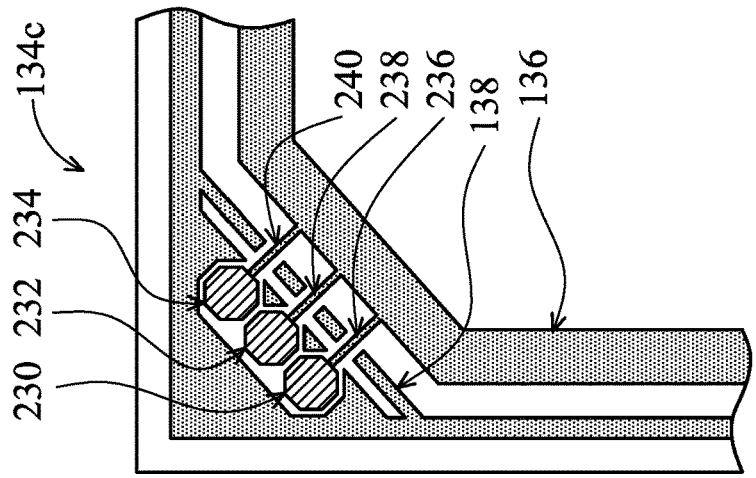
FIG. 11 is a layout view of a seal ring pattern in metallization layers according to an embodiment.

FIG. 11 illustrates a further view 134c with the metallization layers overlaid consecutively and with probe pads 230, 232, and 234 overlaying the metallization layers. The view 134c is a modification of the seal ring pattern of FIGS. 5A and 5B. The probe pads 230, 232, and 234 are formed, for example, contemporaneously with bump bond pads, such as bump bond pads 54 in FIG. 2C. The probe pads 230, 232, and 234 are formed in the corner and are electrically coupled through an interconnect structure (not shown in FIG. 11) and a respective line 236, 238, and 240 to the inner seal ring pattern 136 of a respective metallization layer 154, 156, and 158. The outer seal ring pattern 138 is discontinuous where the lines 236, 238, and 240 intersect the outer seal ring pattern 138. Similar probe pads, interconnect structures, and lines may be formed in each corner.

FIGS. 12A to 12C illustrate cross section views of the structure of FIG. 11. It should be noted that FIGS. 12A to 12C are simplified views because the connections of FIG. 11 generally do not align in a single cross section plane. FIGS. 12A to 12C show the structure after bump bond pads are formed, such as after forming bump bond pads 54 as discussed with regard to FIG. 2C, but before subsequent processing such as discussed with regard to FIGS. 2D or 3A.

FIG. 12A depicts a segment under test 250, which is, in this example, a portion of the first metallization layer 154 in the inner seal ring 164 of FIG. 6 and a segment of the inner seal ring pattern 136 in FIG. 11. At each of opposing ends of the segment under test 250 is an interconnect structure electrically coupling the probe pad 234 to the segment under test 250. Each of the interconnect structures comprises a landing portion 260 of the third metallization layer 158, a landing portion 262 of the second metallization layer 156, a via 264 connecting the landing portions 260 and 262, and a via 266 connecting the landing portion 262 to a combination of a landing portion and line 240 of the first metallization layer 154.

FIG. 12B depicts a segment under test 252, which is, in this example, a portion of the second metallization layer 156 in the inner seal ring 164 of FIG. 6 and a segment of the inner seal ring pattern 136 in FIG. 11. At each of opposing ends of the segment under test 252 is an interconnect structure electrically coupling the probe pad 232 to the segment under test 252. Each of the interconnect structures comprises a landing portion 268 of the third metallization layer 158 and a via 270 connecting the landing portion 268 to a combination of a landing portion and line 238 of the second metallization layer 156.

FIG. 12C depicts a segment under test 254, which is, in this example, a portion of the third metallization layer 158 in the inner seal ring 164 of FIG. 6 and a segment of the inner seal ring pattern 136 in FIG. 11. At each of opposing ends of the segment under test 254 is a structure electrically coupling the probe pad 230 to the segment under test 254. Each of the structures comprises a combination of a landing portion and line 236 of the third metallization layer 158.

Although the segments under test 250, 252, and 254 are depicted individually in FIGS. 12A through 12C, the segments under test 250, 252, and 254 are generally overlaid, although other configurations may be used. A person having ordinary skill in the art will readily understand the modifications to the interconnect structures and metallization patterns to form these different structures. As with previous figures, in FIGS. 12A through 12B, portions of other metallization layers may overlie or underlie the segments under test 250, 252, and 254. The segments under test 250, 252, and 254 are typically electrically isolated from portions of a metallization layer that may underlie or overlie the segments under test 250, 252, and 254, with the exception of the portions of the interconnect structures.

After completing processing through the formation of bump bond pads, such as bump bond pads 54 as discussed with regard to FIG. 2C, but before subsequent processing such as discussed with regard to FIGS. 2D or 3A, the segments under test 250, 252, and 254 of the inner seal ring pattern 136 are tested by probing the probe pads 230, 232, and 234 at respective ends of the respective segment. Each of the segments under test 250, 252, and 254 may be tested as discussed with respect to the structures shown in FIGS. 9 and 10. Typically, the segments under test 250, 252, and 254 will be electrically isolated from or independent of other electrical paths. For example, similar to above, the inner seal ring pattern 136, in which each of the segments under test 250, 252, and 254 is formed, typically will not form an enclosed loop, and the segments under test 250, 252, and 254 generally will not be coupled to underlying or overlying metallization to avoid an alternate path for the test signal.

Figure 13:
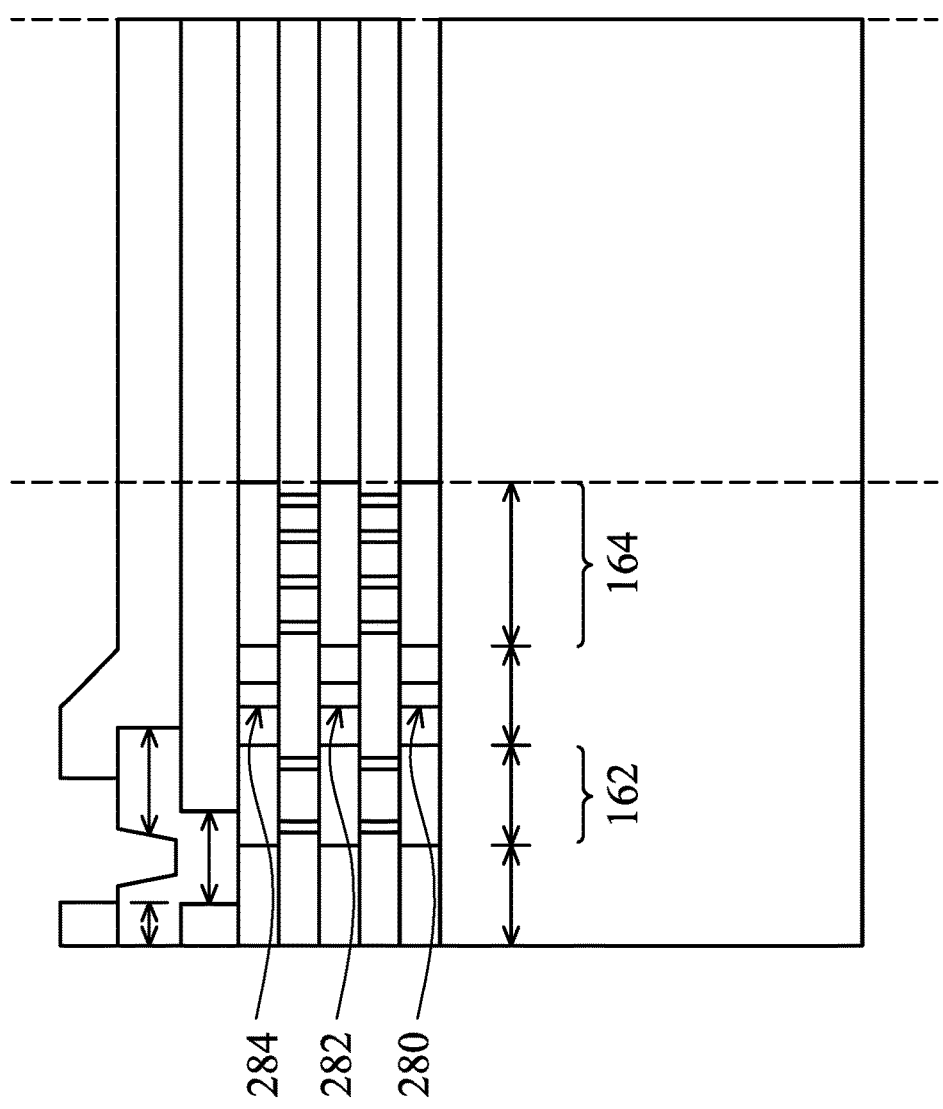
FIG. 13 is a cross section view of seal rings along a periphery of an interposer according to an embodiment.

FIG. 13 illustrates another cross section view of seal rings along a periphery of an interposer similar to FIG. 6. In FIG. 13, the interposer includes a line 280, 282, and 284 between the inner seal ring 164 and the outer seal ring 162 in each of the metallization layers 154, 156, and 158, respectively. The lines 280, 282, and 284 extend similarly along the periphery of the interposer as the seal rings 162 and 164. Further, the lines 280, 282, and 284 have a minimum design rule width in this example. In this example with a 65 nanometer technology node, the minimum design rule width is about 0.324 micrometers, and thus, each of the lines 280, 282, and 284 has a width of about 0.324 micrometers.

Figures 14, 16, 18:
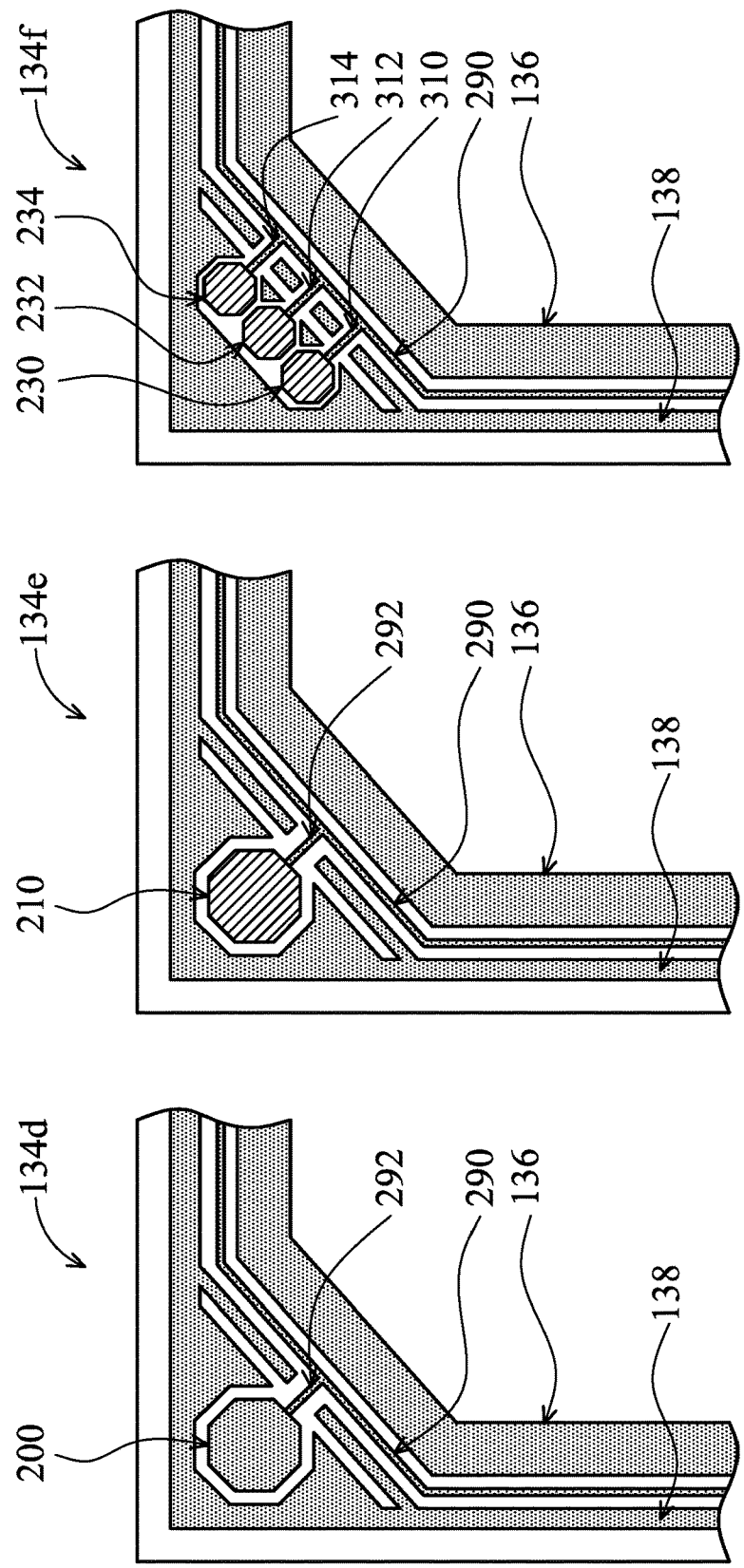
FIG. 14 is a layout view of a seal ring pattern in a metallization layer according to an embodiment.
FIG. 16 is a layout view of a seal ring pattern in a metallization layer according to an embodiment.
FIG. 18 is a layout view of a seal ring pattern in metallization layers according to an embodiment.

FIG. 14 illustrates another view 134d of a metallization layer, which is a modification of the seal ring pattern of FIGS. 5A and 5B. In FIG. 14, a line pattern 290 is between the inner seal ring pattern 136 and the outer seal ring pattern 138. In the view 134d of FIG. 14, a probe pad 200 is formed in the corner and is connected by a line 292 to the line pattern 290. The outer seal ring pattern 138 is discontinuous where the line 292 intersects the outer seal ring pattern 138. Similar probe pads and lines may be formed in each corner.

Figure 15:
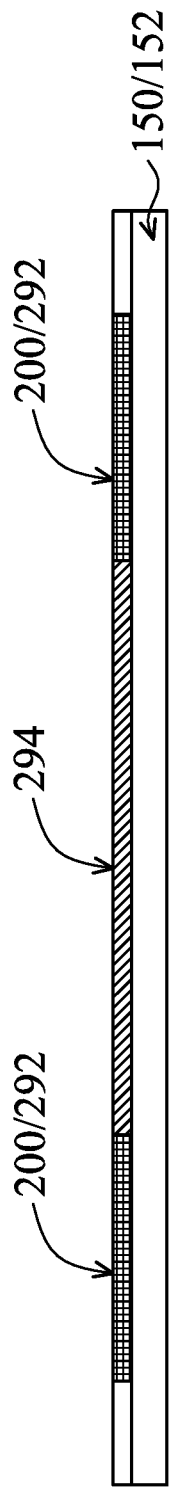
FIG. 15 is a cross section view of the structure of FIG. 14 according to the embodiment.

FIG. 15 illustrates a cross section view of the structure of FIG. 14. FIG. 15 depicts a segment under test 294, which is, for example, one of lines 280, 282, and 284, which is a portion of one of the metallization layers 154, 156, and 158, respectively, of FIG. 13 and a segment of the line pattern 290 in FIG. 14. The segment under test 294 has a combination probe pad 200 and connection 292 at opposing ends of the segment under test 294. The segment under test 294 may be in any of the metallization layers, and therefore, may be over only the substrate 150 or over any of the IMD layers 152 (depicted as "150/152"). The segment under test 294 is electrically isolated or independent and may be tested in the same manner as discussed for the segment under test 204 in FIGS. 7 and 8.

FIG. 16 illustrates another view 134e with a metallization layer overlaid with a probe pad 210. FIG. 16 is a modification of the seal ring pattern of FIGS. 5A and 5B. In FIG. 16, the view 134e includes a line pattern 290 between the inner seal ring pattern 136 and the outer seal ring pattern 138. In the view 134e of FIG. 16, a metallization layer is shown overlaid with a probe pad 210. The probe pad 210 is formed in the corner and is electrically coupled through an interconnect structure (not shown in FIG. 16) and a line 292 to the line pattern 290. The outer seal ring pattern 138 is discontinuous where the line 292 intersects the outer seal ring pattern 138. Similar probe pads, interconnect structures, and lines may be formed in each corner.

Figure 17:
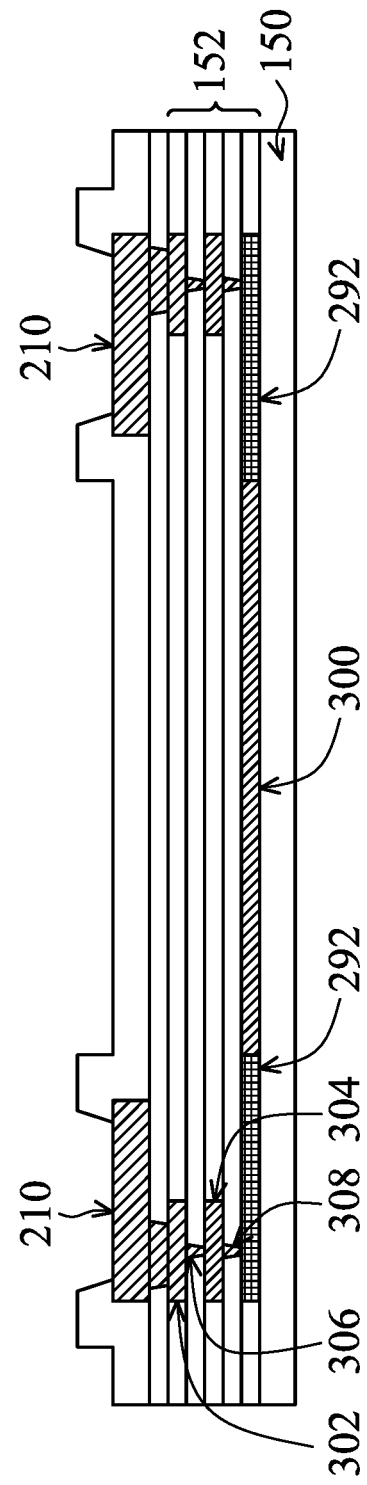
FIG. 17 is a cross section view of the structure of FIG. 16 according to the embodiment.

FIG. 17 illustrates a cross section view of the structure of FIG. 16. FIG. 17 depicts a segment under test 300, which is a portion of the first metallization layer 154 of FIG. 13 and a segment of the line pattern 290 in FIG. 16. At each of opposing ends of the segment under test 300 is an interconnect structure electrically coupling the probe pad 210 to the segment under test 300. Each of the interconnect structures comprises a landing portion 302 of the third metallization layer 158, a landing portion 304 of the second metallization layer 156, a via 306 connecting the landing portions 302 and 304, and a via 308 connecting the landing portion 304 to a combination of a landing portion and line 292 of the first metallization layer 154.

The segment under test 300 may be, for example, any of lines 280, 282, and 284, which is a portion of one of the metallization layers 154, 156, and 158, respectively, of FIG. 13. A person having ordinary skill in the art will readily understand the modifications to the interconnect structures and metallization patterns to form these different structures. It is worth noting that portions of other metallization layers may overlie or underlie the segment under test 300. The segment under test 300 is typically electrically isolated from portions of a metallization layer that may underlie or overlie the segment under test 300, with the exception of the portions of the interconnect structures. The segment under test 300 may be tested in the same manner as discussed for the segment under test 212 in FIGS. 9 and 10.

FIG. 18 illustrates a further view 134f with the metallization layers overlaid consecutively and with probe pads 230, 232, and 234 overlaying the metallization layers. The view 134f is a modification of the seal ring pattern of FIGS. 5A and 5B. In FIG. 18, the view 134f includes a line pattern 290 between the inner seal ring pattern 136 and the outer seal ring pattern 138. The probe pads 230, 232, and 234 are formed in the corner and are electrically coupled through an interconnect structure (not shown in FIG. 18) and a respective line 310, 312, and 314 to the line pattern 290 of a respectively metallization layer 154, 156, and 158. The outer seal ring pattern 138 is discontinuous where the lines 310, 312, and 314 intersect the outer seal ring pattern 138. Similar probe pads, interconnect structures, and lines may be formed in each corner.

FIGS. 19A to 19C illustrate cross section views of the structure of FIG. 18. FIG. 19A depicts a segment under test 320, which is, in this example, a portion of the line 280 in the first metallization layer 154 of FIG. 13 and a segment of the line pattern 290 in FIG. 18. At each of opposing ends of the segment under test 320 is an interconnect structure electrically coupling the probe pad 234 to the segment under test 320. Each of the interconnect structures comprises a landing portion 330 of the third metallization layer 158, a landing portion 332 of the second metallization layer 156, a via 334 connecting the landing portions 330 and 332, and a via 336 connecting the landing portion 332 to a combination of a landing portion and line 314 of the first metallization layer 154.

FIG. 19B depicts a segment under test 322, which is, in this example, a portion of the line 282 in the second metallization layer 156 of FIG. 13 and a segment of the line pattern 290 in FIG. 18. At each of opposing ends of the segment under test 322 is an interconnect structure electrically coupling the probe pad 232 to the segment under test 322. Each of the interconnect structures comprises a landing portion 338 of the third metallization layer 158 and a via 340 connecting the landing portion 338 to a combination of a landing portion and line 312 of the second metallization layer 156.

FIG. 19C depicts a segment under test 324, which is, in this example, a portion of the line 284 in the third metallization layer 158 of FIG. 13 and a segment of the line pattern 290 in FIG. 18. At each of opposing ends of the segment under test 324 is a structure electrically coupling the probe pad 230 to the segment under test 324. Each of the structures comprises a combination of a landing portion and line 310 of the third metallization layer 158.

Although the segments under test 320, 322, and 324 are depicted individually in FIGS. 19A through 19C, the segments under test 320, 322, and 324 are generally overlaid, although other configurations may be used. A person having ordinary skill in the art will readily understand the modifications to the interconnect structures and metallization patterns to form these different structures. As with previous figures, portions of other metallization layers may overlie or underlie the segments under test 320, 322, and 324. The segments under test 320, 322, and 324 are typically electrically isolated from portions of a metallization layer that may underlie or overlie the segments under test 320, 322, and 324, with the exception of the portions of the interconnect structures. Further, the line pattern 290, in which each of the segments under test 320, 322, and 324 is formed, typically will not form an enclosed loop to avoid an alternate path for the test signal. Each of the segments under test 320, 322, and 324 may be tested as discussed with respect to the structures shown in FIGS. 11 and 12A through 12C.

Figure 20:
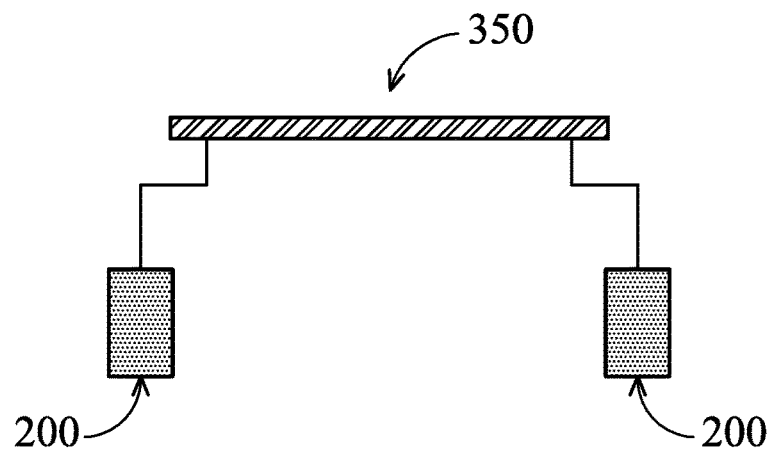
FIGS. 20 and 21 are general concepts of testing a segment under test according to an embodiment.
Figure 21:
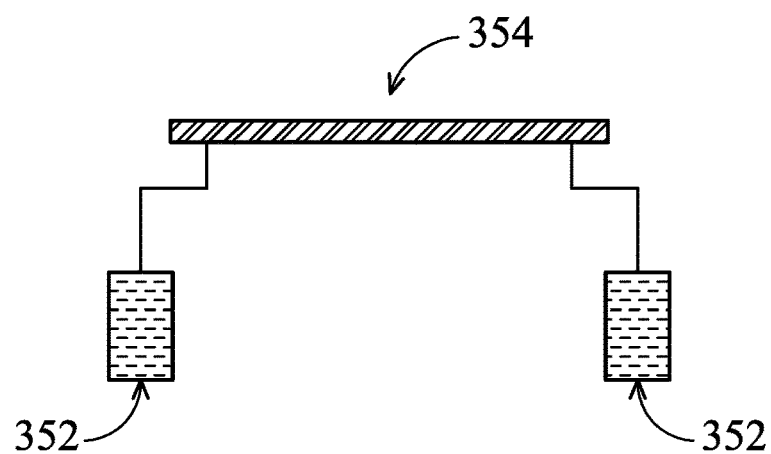

FIGS. 20 and 21 illustrate general concepts of testing a segment under test. In FIG. 20, probe pads 200 are probed to apply and sense a test signal through a segment under test 350. The probe pads 200 are also shown in FIGS. 8 and 15, and the segment under test may be the segment under test 204 or 294 in FIG. 8 or 15, respectively. In FIG. 21, probe pads 352 are electrically coupled, for example, through interconnect structures to a segment under test 354. The probe pads 352 are probed to apply and sense a test signal through the segment under test 354. The probe pads 352 may be the probe pads 210, 230, 232, and 234, and the segment under 354 may be the segment under test 212, 250, 252, 254, 300, 320, 322, and 324, as shown in FIGS. 10, 12A, 12B, 12C, 17, 19A, 19B, and 19C.

Figure 22:
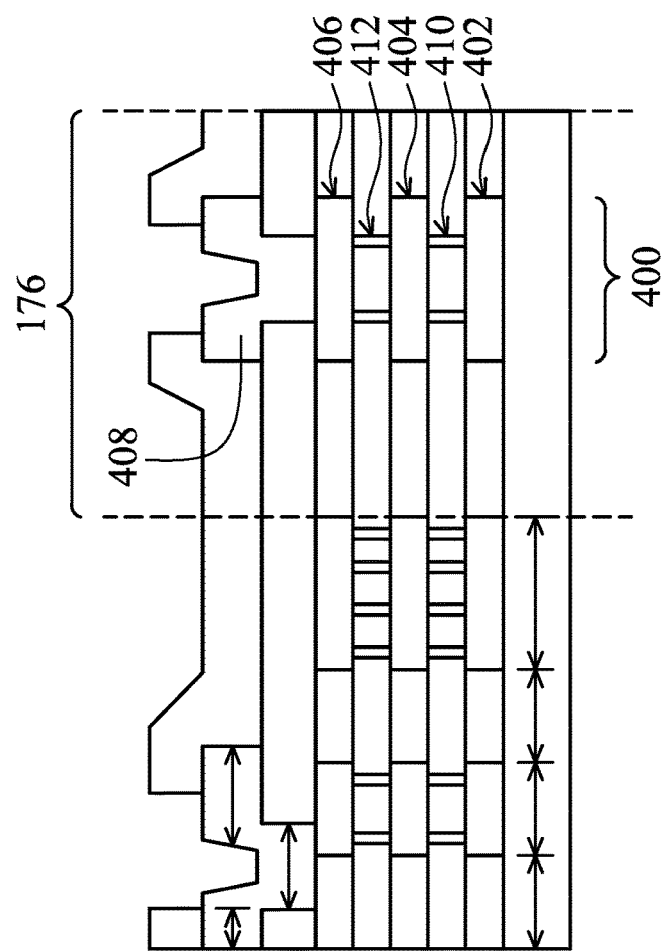
FIG. 22 is cross section view of a dummy metal via daisy chain in the isolation area of an interposer.

FIG. 22 illustrates cross section view of a dummy metal via daisy chain in the isolation area of an interposer. FIG. 22 is similar to FIG. 6 except for a dummy metal via daisy chain ("via chain") structure 400 in the isolation area 176. The via chain structure 400 includes a first portion 402 of the first metallization layer 154, a second portion 404 of the second metallization layer 156, vias 410 connecting the first portion 402 and the second portion 404, a third portion 406 of the third metallization layer 158, vias 412 connecting the second portion 404 and the third portion 406, and a probe pad 408 exposed through the second passivation layer 174 and connected to the third portion 406. In this example, the metallization layers 154, 156, and 158 are copper, and the probe pad 408 is aluminum or copper aluminum, although other materials previously discussed may be used for these components.

Figure 23:
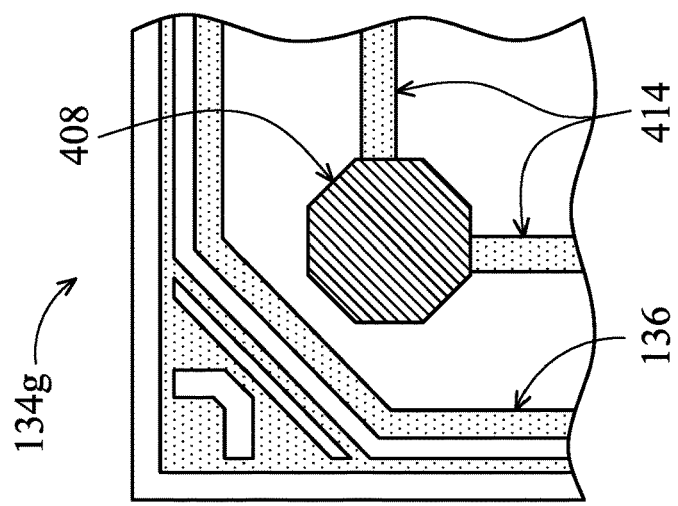
FIG. 23 is a layout view of a seal ring pattern with the metallization layers overlaid consecutively and with a probe pad overlaying the metallization layers according to an embodiment.

FIG. 23 illustrates a further view 134g with the metallization layers overlaid consecutively and with the probe pad 408 overlaying the metallization layers. The view 134g is a modification of FIGS. 5A and 5B. Via chain pattern 414 of the combined metallization layers illustrates the area in which the via chain structure 400 is formed. The via chain pattern 414 may extend along a periphery of the interposer, such as along each edge of the interposer, and generally is interior to the inner seal ring pattern 136 in the isolation area 176. The probe pad 408 is electrically coupled to the via chain pattern 414. Similar probe pads and lines may be formed in each corner.

Figure 24:
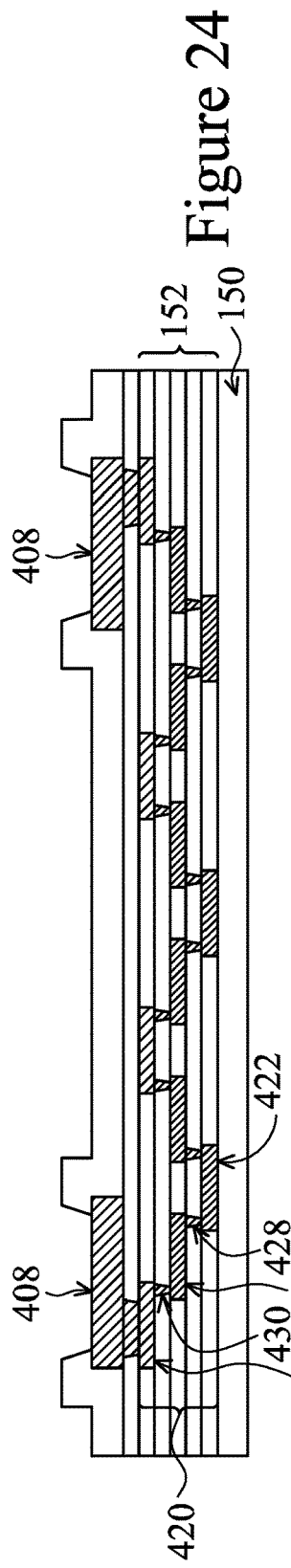
FIGS. 24 through 26 are cross section views of different configurations of the via chain structure in FIG. 23 according to various embodiments.
Figure 25:
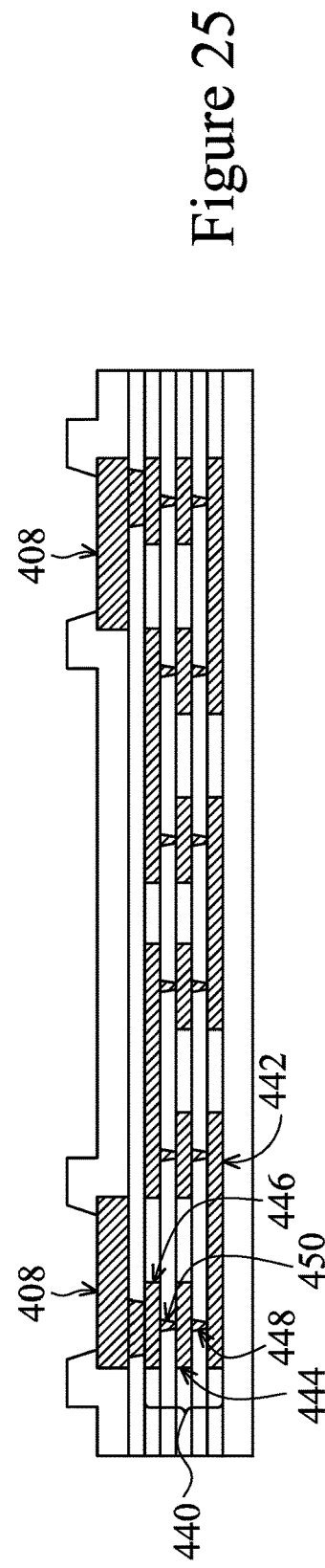
Figure 26:
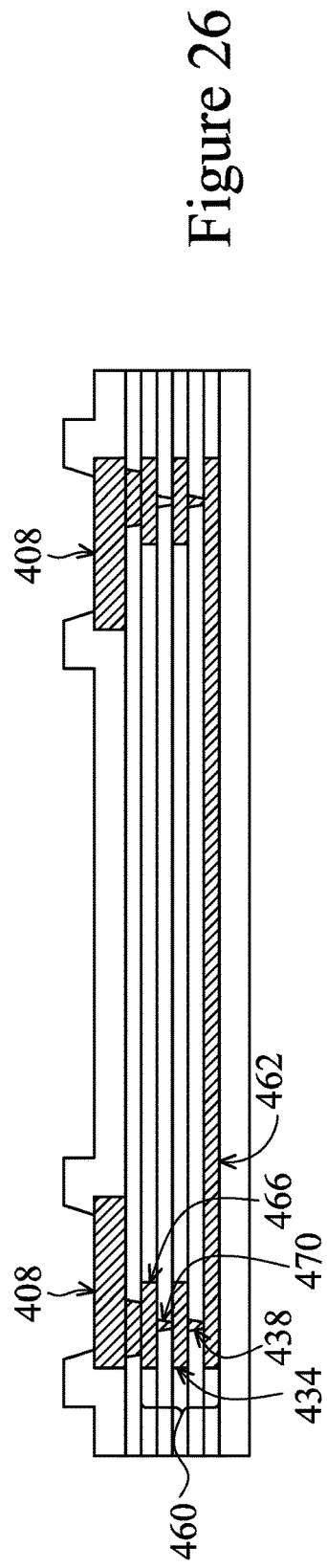

FIGS. 24 through 26 depict cross section views of different configurations of the via chain structure 400. FIGS. 24 through 26 show the structure after bump bond pads are formed, such as after forming bump bond pads 54 as discussed with regard to FIG. 2C, but before subsequent processing such as discussed with regard to FIGS. 2D or 3A.

FIG. 24 shows a via chain under test 420 between probe pads 408. The via chain under test 420 comprises landing portions 422 of the first metallization layer 154, landing portions 424 of the second metallization layer 156, vias 428 connecting respective landing portions 422 and 424, landing portions 426 of the third metallization layer 158, and vias 430 connecting respective landing portions 424 and 426. In this configuration, the landing portions and vias are stair-stepped through the various IMD layers 152. For example, the landing portions do not completely vertically align in the IMD layer 152 although landing portions in adjacent metallization layers partially overlap, and the vias do not vertically align. This configuration also shows three full cycles of the via chain under test 420 through the metallization and IMD layers. Other configurations may have different numbers of cycles, and in even further configurations, each cycle may not extend through each of the layers.

FIG. 25 shows a via chain under test 440 between probe pads 408. The via chain under test 440 comprises landing portions 442 of the first metallization layer 154, landing portions 444 of the second metallization layer 156, vias 448 connecting respective landing portions 442 and 444, landing portions 446 of the third metallization layer 158, and vias 450 connecting respective landing portions 444 and 446. In this configuration, the landing portions and vias are in a "ladder" or "elevator" configuration through the various IMD layers 152. For example, landing portions vertically align in the IMD layer 152, and vias vertically align. This configuration also shows three full cycles of the via chain under test 440 through the metallization and IMD layers. Other configurations may have different numbers of cycles, and in even further configurations, each cycle may not extend through each of the layers.

FIG. 26 shows a via chain under test 460 between probe pads 408. The via chain under test 460 comprises a line 462 of the first metallization layer 154, landing portions 464 of the second metallization layer 156, vias 468 connecting the line 462 to landing portion 464, landing portions 466 of the third metallization layer 158, and vias 470 connecting respective landing portions 464 and 466. In this configuration, the landing portions and vias are in a "ladder" or "elevator" configuration through the various IMD layers 152, as in FIG. 25. The line 462 may be an ultra long test line, such as approximately 10 millimeters, to test a front side RDL chain yield. The line 462 may be on any metallization layer.

The via chain under test 420, 440, or 460 is typically electrically isolated from other portions of a metallization layer that are not depicted in the figures. Thus, the via chain under test 420, 440, or 460 may be independent during testing.

Figure 27:
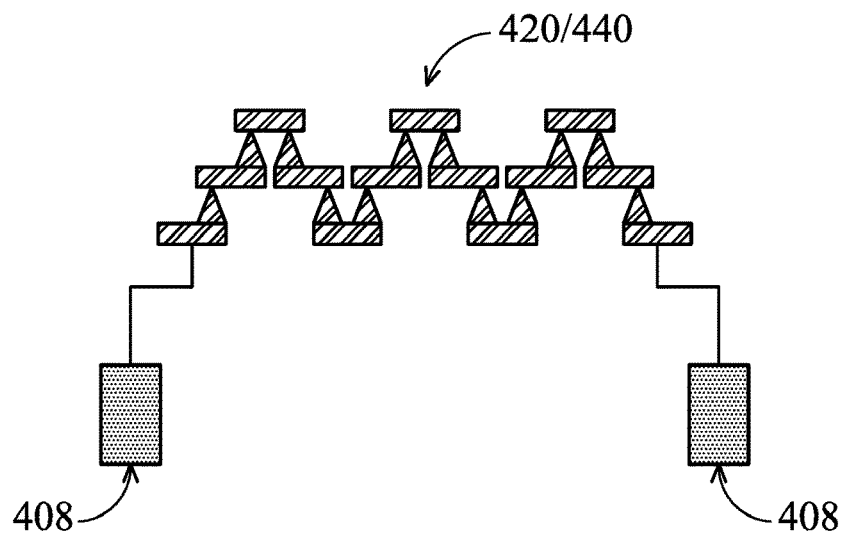
FIGS. 27 and 28 are general concepts of testing a via chain under test according to embodiments.
Figure 28:
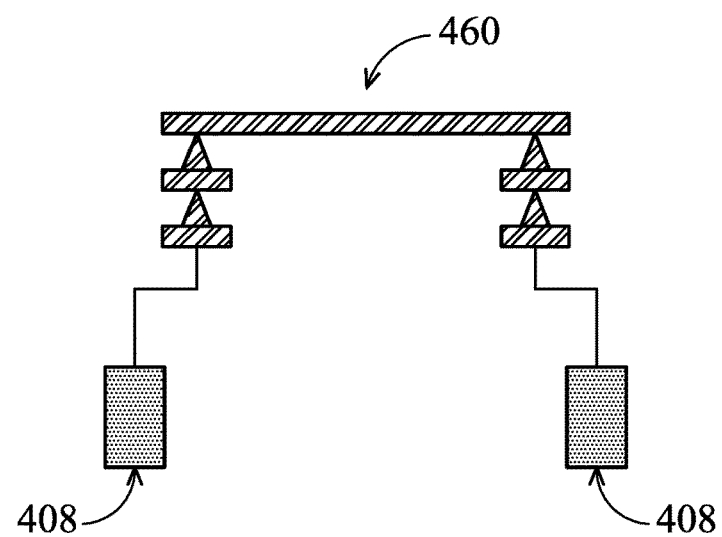

After completing processing through the formation of bump bond pads, such as bump bond pads 54 as discussed with regard to FIG. 2C, but before subsequent processing such as discussed with regard to FIGS. 2D or 3A, the via chain under test 420, 440, or 460 of the via chain structure 400 is tested by probing the probe pads 408 at respective ends of the via chain. FIGS. 27 and 28 generally show the tested structure. In FIG. 27, probe pads 408 are probed to apply and sense a test signal through a via chain under test 420/440. FIG. 27 shows the cycles of vias and landing portions in the via chain structure 400. In FIG. 28, probe pads 408 are electrically coupled to the via chain under test 460 that comprises vias and a line, as shown in FIG. 26. The probe pads 408 are probed to apply and sense a test signal through the via chain under test 460. By applying a signal at one probe pad 408, it can be determined whether the via chain under test 420, 440, or 460 has a void or discontinuity in a via or a metallization of the via chain structure 400 by sensing a signal at another probe pad 408 at an opposite end of the via chain under test 420, 440, or 460. Typically, the via chain under test 420, 440, or 460 will be electrically isolated from or independent of other electrical paths. For example, the via chain pattern 414, in which the via chain under test 420, 440, or 460 is formed, typically will not form an enclosed loop, and the via chain under test 420, 440, or 460 generally will not be coupled to other portions of a metallization layer to avoid an alternate path for the test signal.

Figure 29:
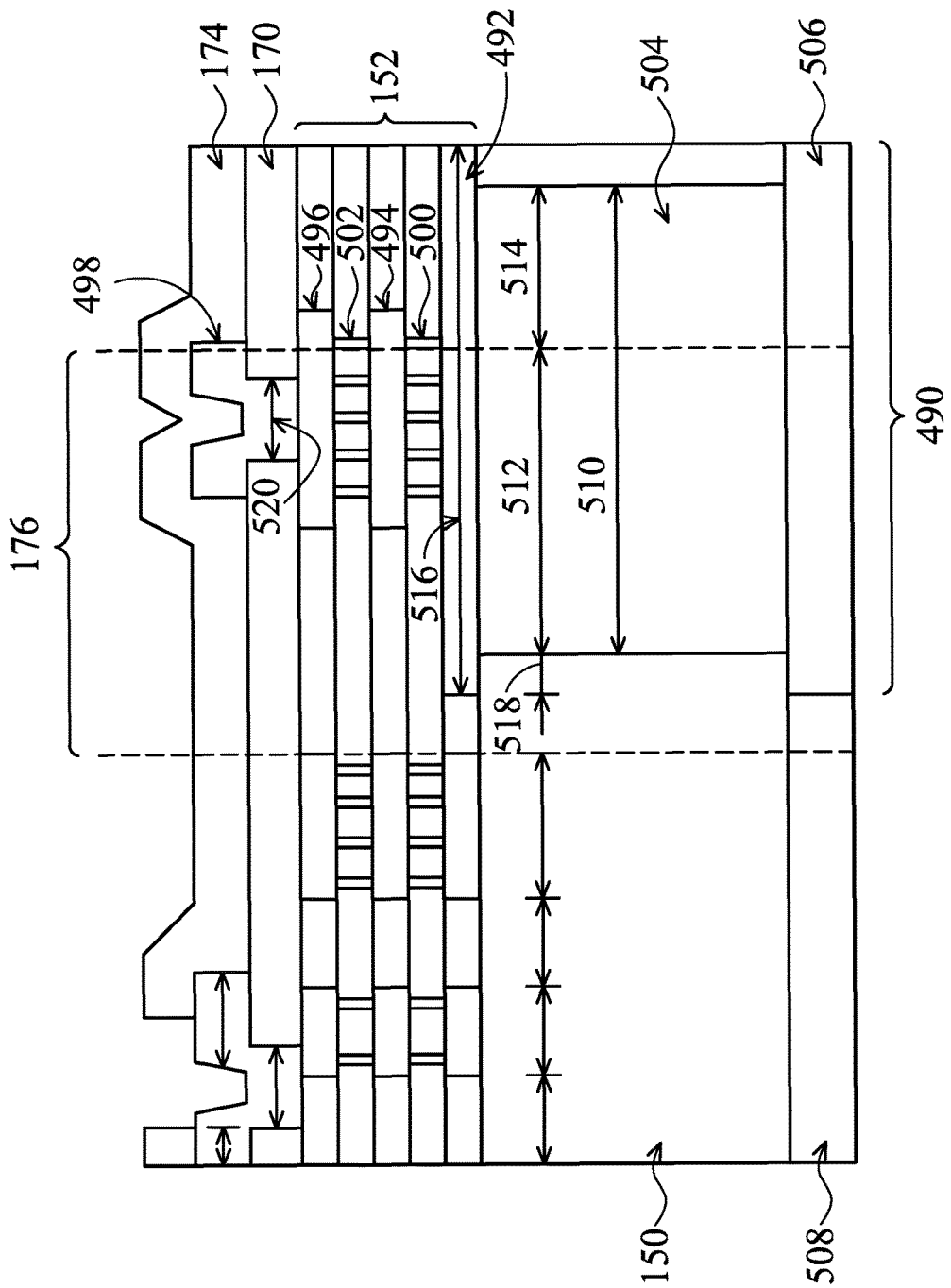
FIG. 29 is a cross section view of a portion of a dummy through substrate via (TSV) daisy chain in an isolation area of an interposer according to an embodiment.

FIG. 29 illustrates a cross section view of a portion of a dummy TSV daisy chain in the isolation area 176 of an interposer. FIG. 29 is similar to FIG. 6 except for a dummy TSV daisy chain ("TSV chain") structure 490 in the isolation area 176. The TSV chain structure 490 includes a back side metallization portion 506 in a back side dielectric layer 508, a TSV 504 through the substrate 150 and connected to the back side metallization portion 506, a first portion 492 of the first metallization layer 154 connected to the TSV 504, a second portion 494 of the second metallization layer 156, vias 500 connecting the first portion 492 and the second portion 494, a third portion 496 of the third metallization layer 158, vias 502 connecting the second portion 494 and the third portion 496, and a pad 498 under the second passivation layer 174 and connected to the third portion 496.

In this example, the TSV 504 has a width 510 of approximately 12 micrometers. A first TSV portion 512 of the TSV width 510 is in the isolation area 176 and is approximately 8 micrometers. A second TSV portion 514 of the TSV width 510 is outside of the isolation area 176 and is approximately 4 micrometers. Further in this example, the first portion 492 of the first metallization layer 154 has a width 516 of approximately 14 micrometers and an overhang portion 518 extending out from the TSV 504 of approximately 1 micrometer. Further, the pad 498 has a width 520 between sidewalls of the first passivation layer 170 of approximately 2 micrometers.

Figure 30:
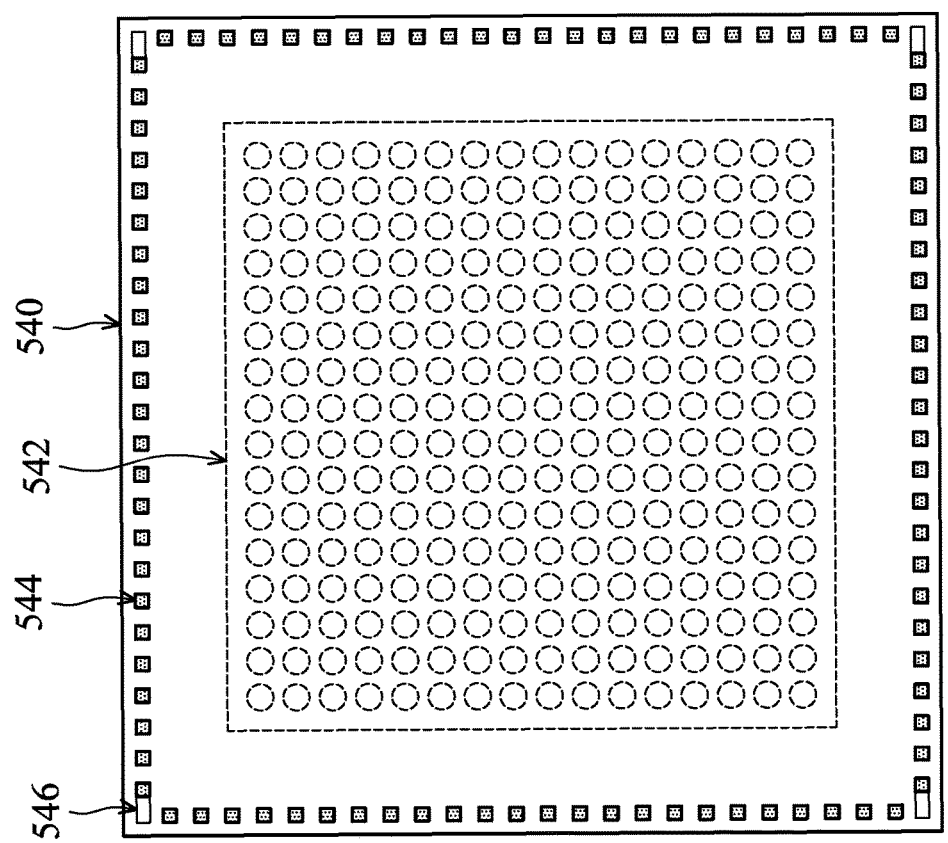
FIG. 30 is a plan view of a back side of an interposer according to an embodiment.

FIG. 30 depicts a plan view of a back side 540 of an interposer with a front side pattern 542 shown in phantom. The back side 540 includes a back side chain pattern 544 and probe pads 546 in the back side metallization 506 of the interposer. The probe pads 546 are formed in the corners of the interposer. The back side chain pattern 544 is a portion of the TSV chain structure 490 shown in FIG. 29. Two of the probe pads 546 are electrically coupled to an independent TSV chain under test.

Figure 31:
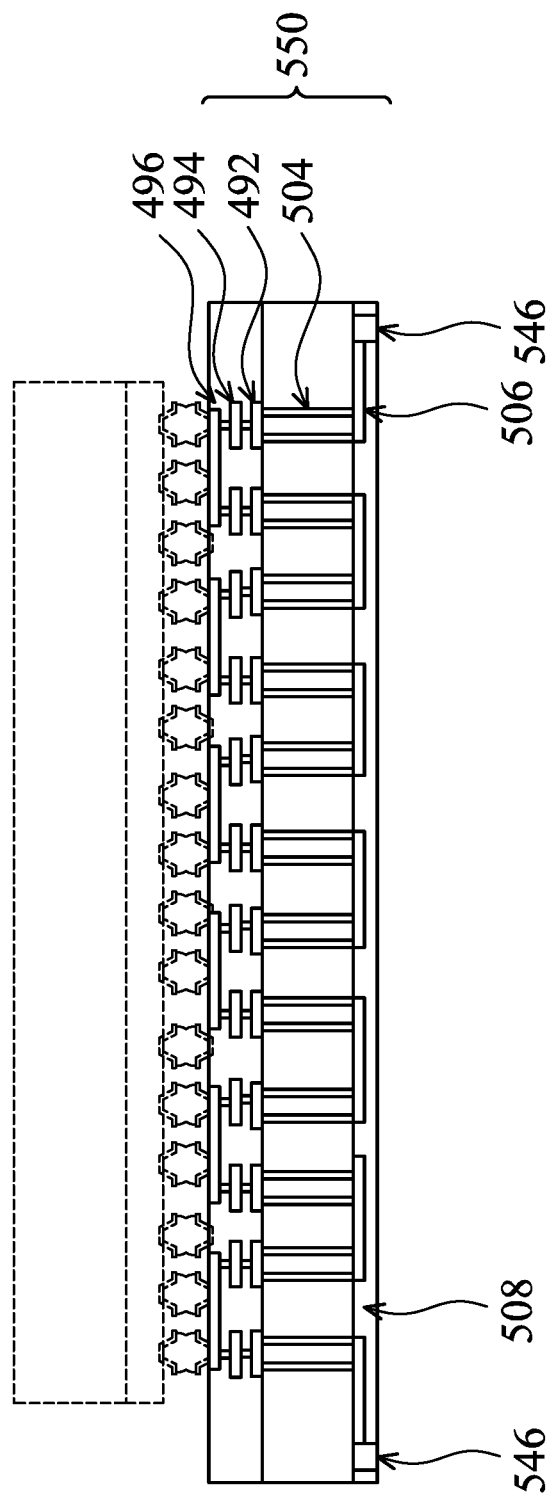
FIG. 31 is a cross section view of the interposer of FIG. 30 according to the embodiment.

FIG. 31 illustrates a cross section view of the structure of FIG. 30. It should be noted that FIG. 31 shows a die and bumps in phantom as a reference point because a die and bumps typically do not intersect the depicted plane of the isolation area in which the TSV chain structure 490 is formed. Further, the structures depicted may not be in a same cross section plane. FIG. 31 shows the structure before processing is completed, such as after back side thinning and back side metallization deposition but before formation of balls, as discussed with regard to FIGS. 2F and 3B.

FIG. 31 depicts a TSV chain under test 550, which includes, for example, portions 492, 494, and 496 of the metallization layers 154, 156, and 158, respectively, on the front side of the interposer, portions of the back side metallization layer 506, and TSVs 504 of FIG. 29, with probe pads 546 at opposing ends of the TSV chain under test 550. As shown in FIG. 31, the TSVs 504 are electrically coupled together in a daisy chain through the portions 496 of the third metallization layer 158 on the front side and through the portions of the back side metallization layer 506. The TSVs 504 in the TSV chain under test 550 may be electrically coupled by any of the metallization layers, such as directly coupled by the portions 492 of the first metallization layer 154 and directly coupled by the portions of the back side metallization layer 506. Other combinations of metallization layers to form a daisy chain, or serial electrical coupling, are within the skill of a person having ordinary skill in the art and are contemplated within the scope of other embodiments. The TSV chain under test 550 is electrically isolated from other portions of metallization layers.

After forming the back side metallization layer and corresponding IMD layer or passivation layer but before the formation of conductive balls, such as conductive balls 72 in FIGS. 2G and 3C, the TSV chain under test 550 in the isolation area 176 is tested by probing the probe pads 546 at respective ends of the chain. By applying a signal at one probe pad 546, it can be determined whether the TSV chain under test 550 has a void or discontinuity in the chain by sensing a signal at another probe pad 546 at an opposite end of the TSV chain under test 550. Typically, the TSV chain under test 550 will be electrically isolated from or independent of other electrical paths. For example, various metallization layers, such as the back side chain portion 544, in which the TSV chain under test 550 is formed, typically will not form an enclosed loop because doing so will allow the test signal to travel around the loop between the probe pads when the TSV chain under test 550 is open, e.g., has a void or discontinuity. After testing, a subsequent IMD layer and/or passivation layer may be formed. If a metallization layer is formed over the back side metallization layer of which the TSV chain under test 204 is a part, the overlying back side metallization layer may be electrically coupled to the TSV chain under test 550 because the testing occurred before the formation of the overlying metallization layer.

Figure 32:
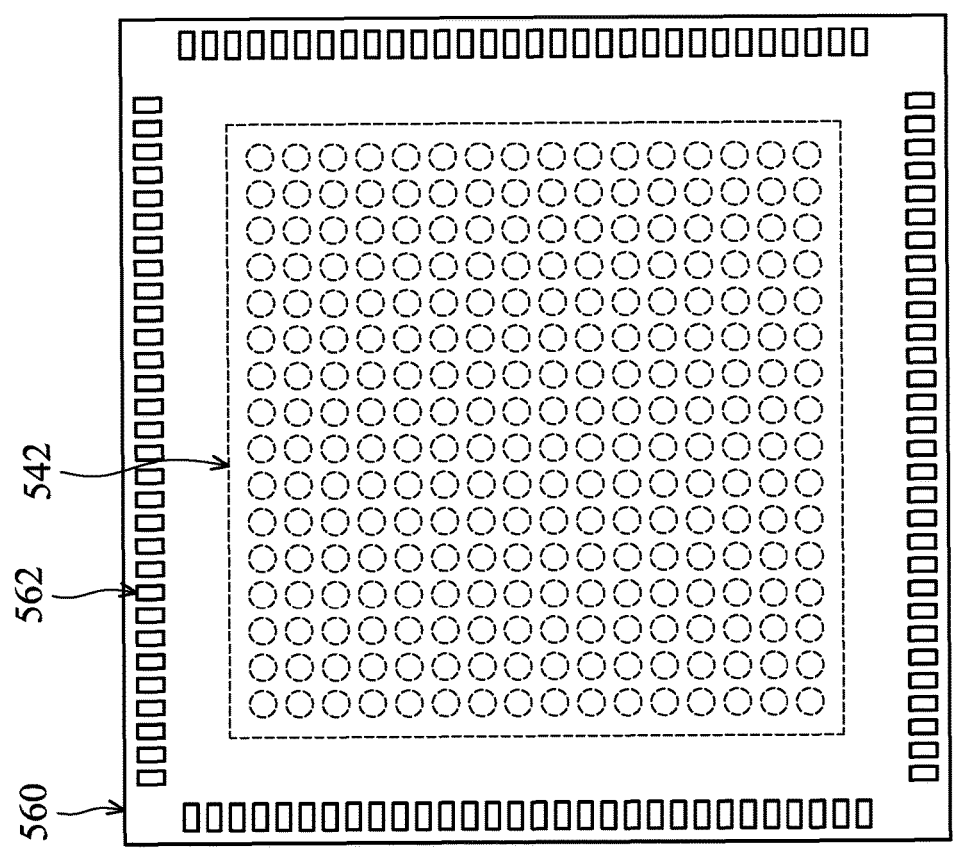
FIG. 32 is a plan view of a back side of an interposer according to an embodiment.

FIG. 32 depicts a plan view of a back side 560 of an interposer with a front side pattern 542 shown in phantom. The back side 560 includes probe pads 562 in the back side metallization 506 of the interposer. The probe pads 546 are formed along a periphery of the interposer in the isolation area 176. Also present in the back side metallization 506, but not specifically shown in FIG. 32, are interconnects between TSVs 504 of a TSV chain structure, similar to the TSV chain structure 490 shown in FIG. 29 but not generally in the isolation area 176. Two of the probe pads 562 in the isolation area 176 are electrically coupled to an independent TSV chain under test.

Figure 33:
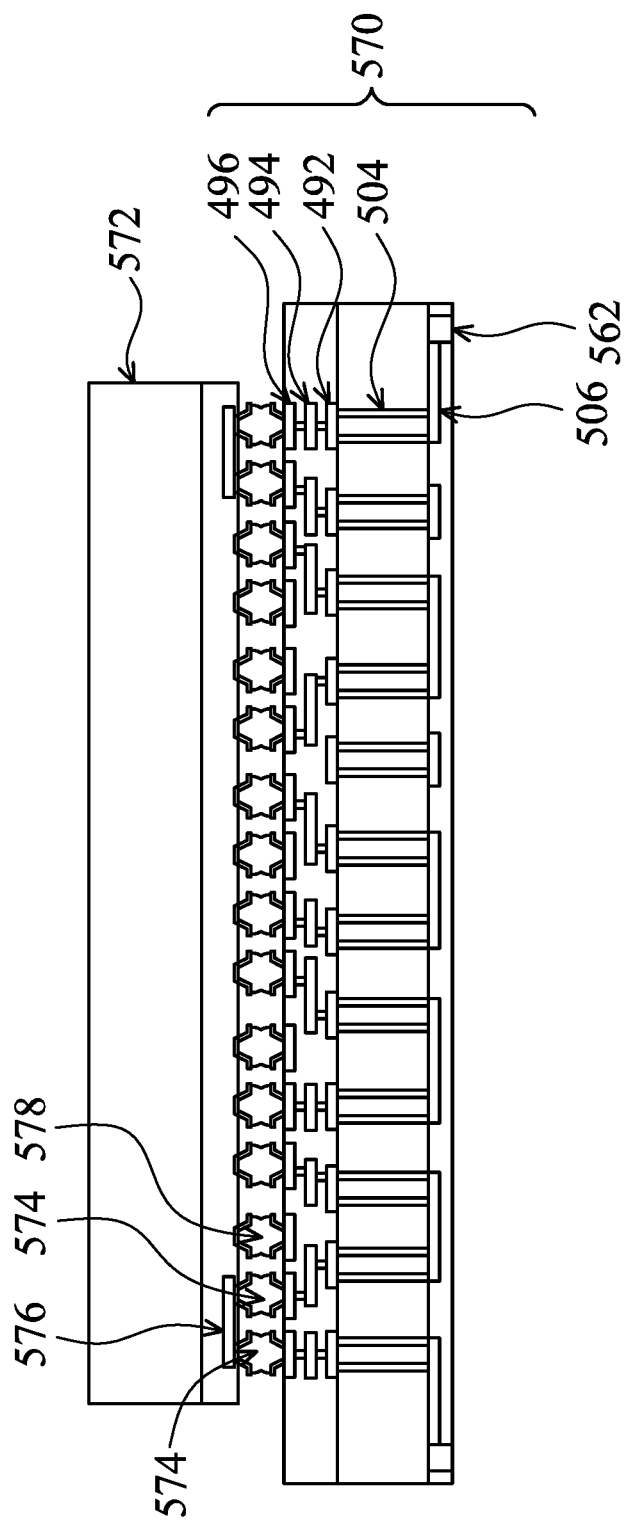
FIG. 33 is a cross section view of the interposer of FIG. 32 with an attached die according to the embodiment.

FIG. 33 illustrates a cross section view of the structure of FIG. 32. The structures depicted in FIG. 33 are shown in a cross section plane for simplicity of illustration and may not necessarily be in a same cross section plane. FIG. 33 shows the structure before processing is completed, such as after back side thinning and back side metallization deposition but before formation of balls, as discussed with regard to FIGS. 2F and 3B. FIG. 33 shows a die 572 connected to an interposer o form a TSV chain under test 570. The TSV chain under test 570 includes, for example similar to FIG. 31, portions 492, 494, and 496 of the metallization layers 154, 156, and 158, respectively, on the front side of the interposer, a portion of the back side metallization layer 506, TSVs 504, and probe pads 546 at opposing ends of the TSV chain under test 570. The TSV chain under test 570 further includes dummy bump structures 574, which include corresponding bump pads of the interposer and of the die 572, and portions 576 of a metallization layer of the die 572. Active bump structures 578 are also illustrated for reference.

As shown in FIG. 33, the TSVs 504 are electrically coupled together in a daisy chain through the portions 576 of the metallization layer of the die 572 and through the portions of the back side metallization layer 506. The TSVs 504 in the TSV chain under test 570 may be electrically coupled by any of the metallization layers of the die 572. Other combinations of metallization layers to form a daisy chain are within the skill of a person having ordinary skill in the art and are contemplated within the scope of other embodiments. The TSV chain under test 570 is electrically isolated from other portions of metallization layers, such as active portions. The testing of the TSV chain under test 570 may be performed the same as or similar to the testing of the TSV chain under test 550 previously discussed with respect to FIG. 31.

Figure 34:
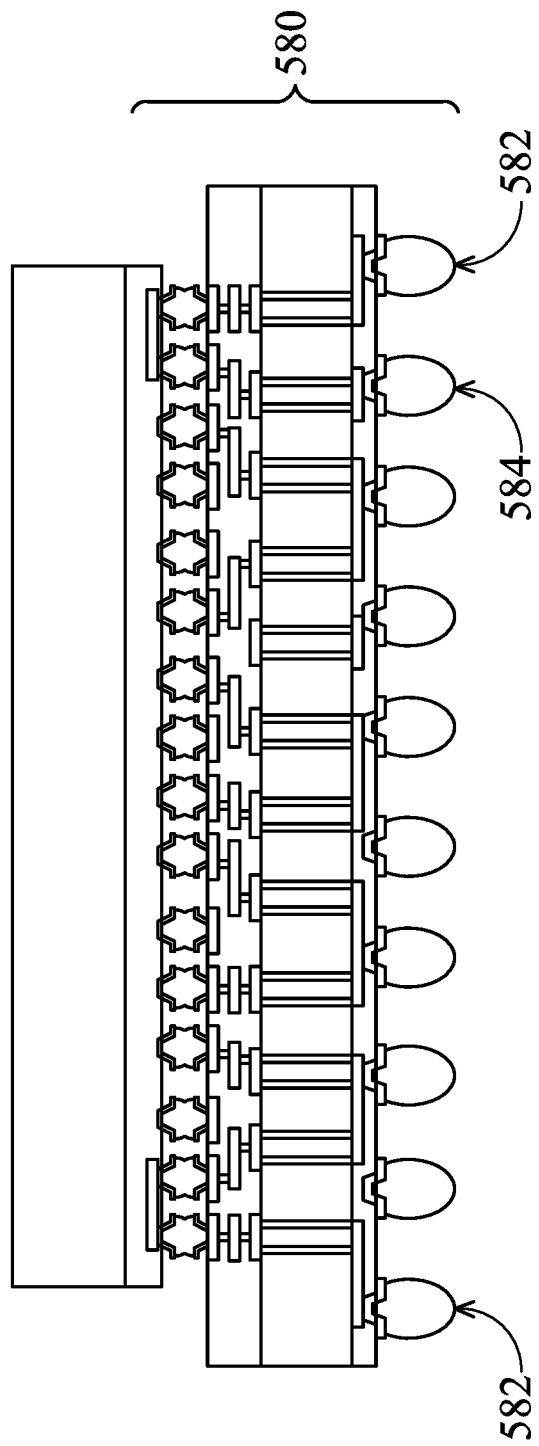
FIG. 34 is a cross section view of an interposer with an attached die according to an embodiment.

FIG. 34 is a modification of FIG. 33. Instead of forming probing pads 546, for example, dummy ball structures 582, which include corresponding underlying bond pads, are formed for testing the TSV chain under test 580. An active ball structure 584 is also shown for reference. The testing of the TSV chain under test 580 may be performed after the formation of bond pads and/or balls, such as after the formation of ball bond pads 70 and/or conductive balls 72 in FIG. 2G or FIG. 3C. Similar to probing probe pads 546 in FIGS. 31 and 33, the dummy ball structures 582 may be probed to apply and sense a test signal.

Figure 35:
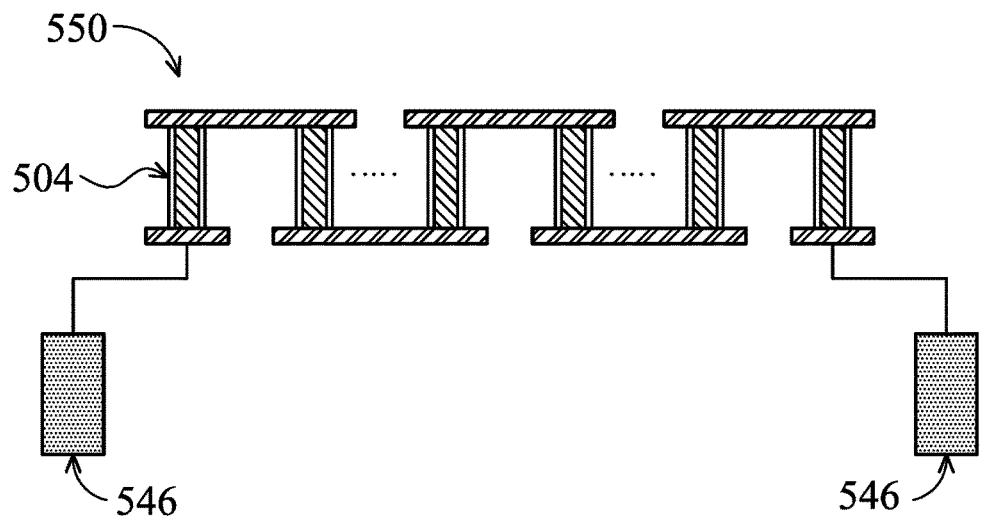
FIGS. 35 through 37 are general concepts of testing a TSV chain under test according to various embodiments.
Figure 36:
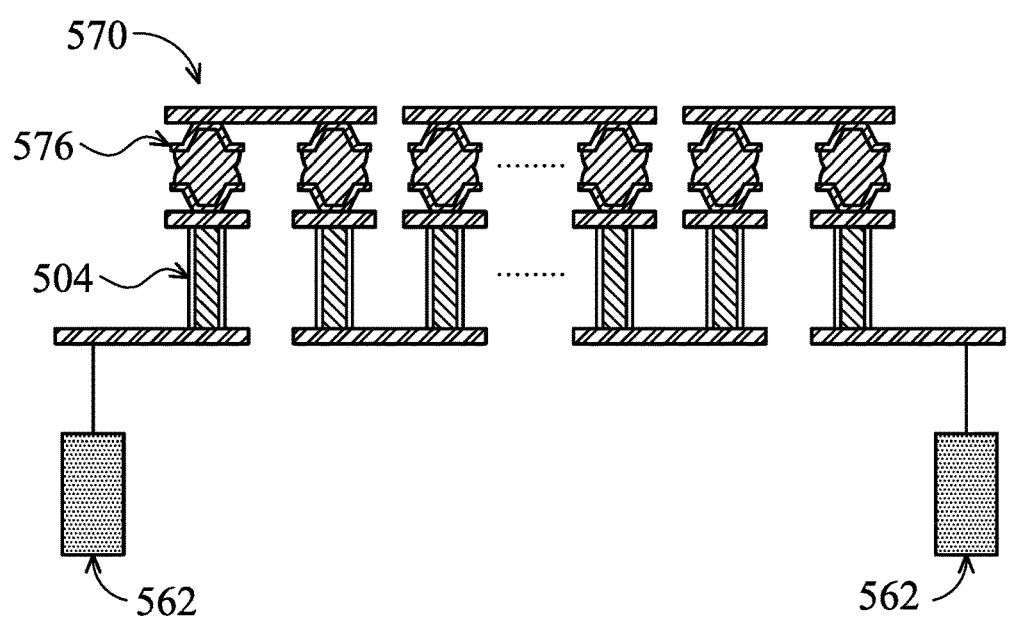
Figure 37:
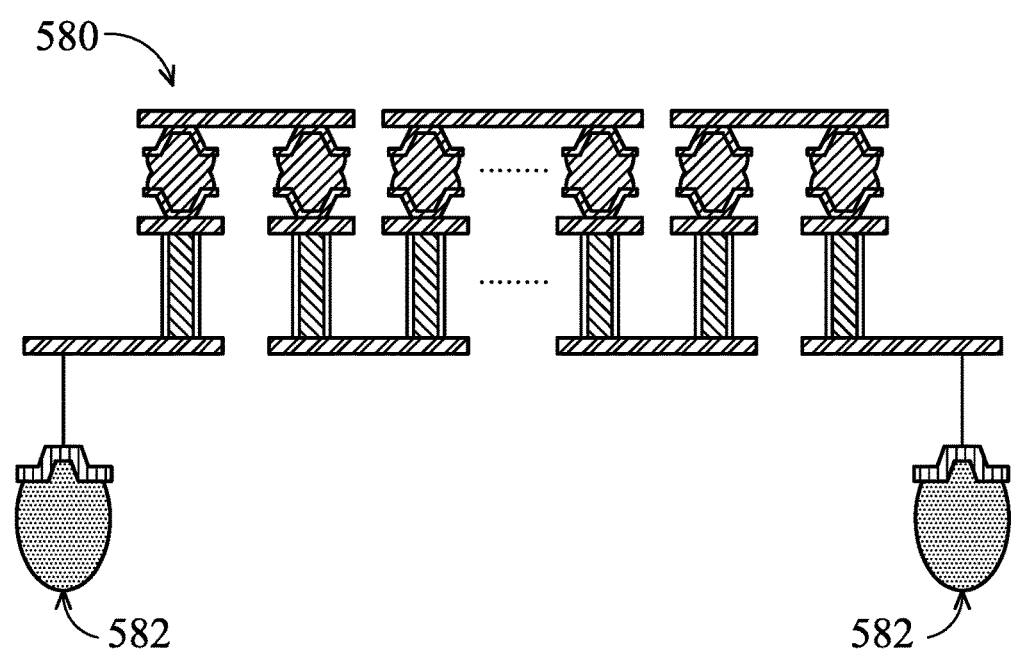

FIGS. 35, 36, and 37 illustrate general concepts of testing a TSV chain under test. In FIG. 35, probe pads 546 are probed to apply and sense a test signal through a TSV chain under test 550, as also shown in FIG. 31. The TSVs 504 are daisy chained together by various metallization layers. In FIG. 36, probe pads 546 are probed to apply and sense a test signal through a TSV chain under test 570, as also shown in FIG. 33. The TSVs 504 are daisy chained together by various metallization layers of the interposer, bump structures, and metallization layer(s) of the die. In FIG. 37, dummy ball structures 582 are probed to apply and sense a test signal through a TSV chain under test 580, as also shown in FIG. 34. The TSVs 504 are daisy chained together by various metallization layers of the interposer, bump structures, and metallization layer(s) of the die.

Figure 38:
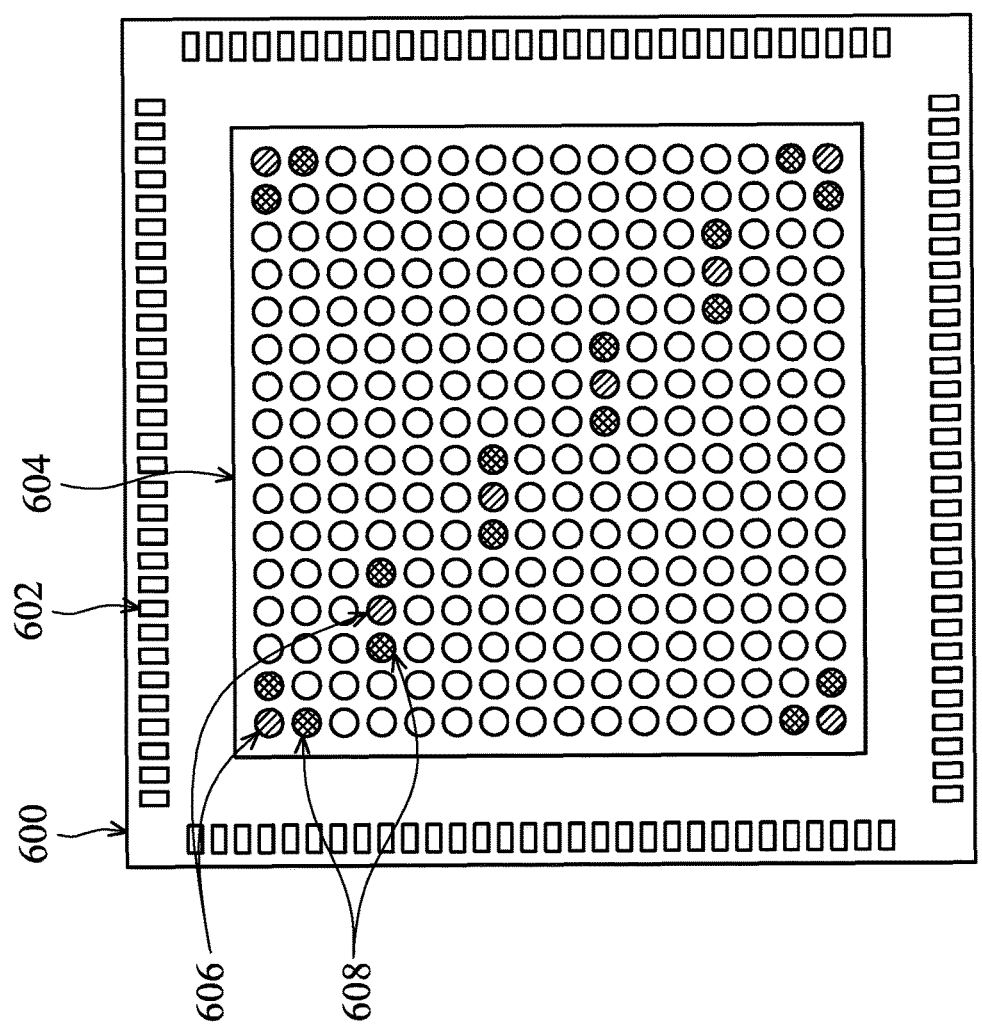
FIG. 38 is a front side pattern of an interposer according to an embodiment.
Figure 39:
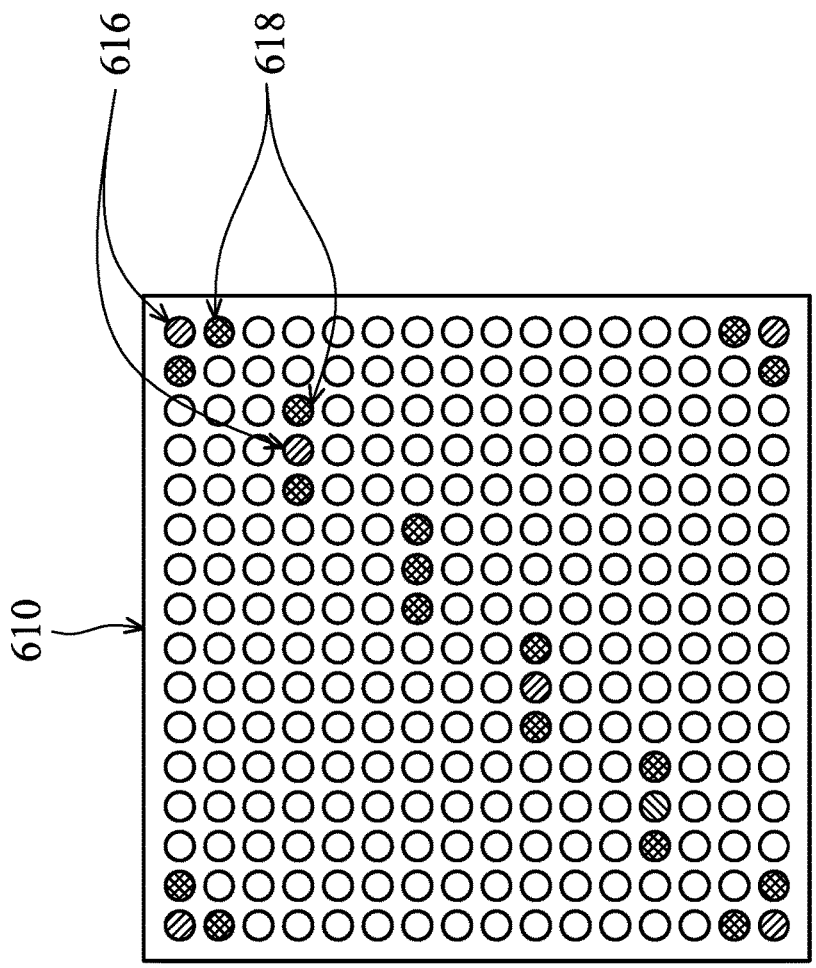
FIG. 39 is an active surface of a die according to an embodiment.

FIGS. 38 and 39 illustrate patterns for bumps under test. FIG. 38 shows a front side pattern 600 of an interposer. The front side pattern 600 includes probe pads 602 along a periphery of the front side pattern 600, a die-attach area 604, bump pads and/or bumps ("BPBs") under test 606, and sense BPBs 608 flanking each BPB under test 606. The BPBs under test 606, and corresponding sense BPBs 608, are located in respective corners of the die-attach area 604 and along a diagonal of the die-attach area 604. Other embodiments contemplate other arrangements of BPBs under test and corresponding sense BPBs.

FIG. 39 illustrates an active surface 610 of a die. The active surface 610 includes BPBs under test 616 and sense BPBs 618. The pattern of the active surface 610 corresponds to the die-attach area 604 such that when the die is flipped to attach to the interposer, BPBs under test 606 and sense BPBs 608 of the interposer align with BPBs under test 616 and sense BPBs 618 of the die, respectively.

Figure 40:
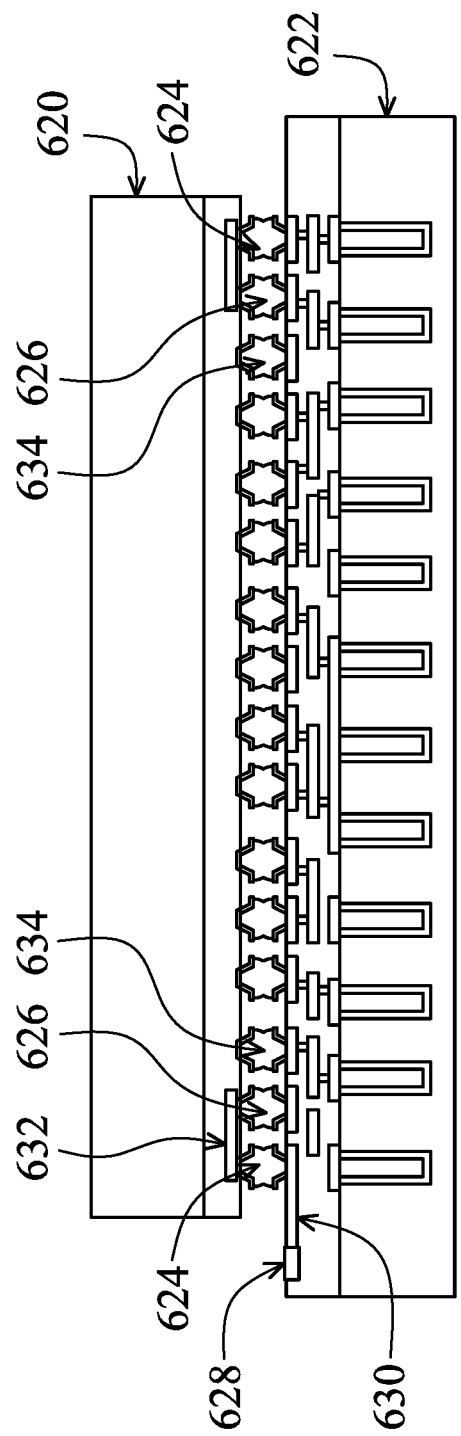
FIG. 40 is a cross section view of a die having an active surface of FIG. 39 attached to an interposer having a front side pattern of FIG. 38 according to an embodiment.

FIG. 40 depicts a cross section view of a die 620 having an active surface 610 as shown in FIG. 39 attached to an interposer 622 having a front side pattern 600 as shown in FIG. 38. The cross section view in this example is along an outer row or column of the bump structures. The interposer 622 has not completed processing in this example but has proceeded through front side processing and die attach, such as processing through FIG. 2D before dispensing underfill. In another embodiment, the interposer 622 has proceeded through processing of FIG. 3E before dispensing underfill. The structure in FIG. 40 includes BPBs under test 624, sense BPBs 626, active BPBs 634, probe pads 628 and portions 630 of the top metallization layer of the interposer 622, and portions 632 of the top metallization layer of the die 620. In this example, the probe pads 628 are aluminum copper, and the portion 632 is aluminum copper or copper, although other materials previously discussed may be used.

Referring to FIGS. 38 through 40, each BPB under test 624 (corresponding to 606 and 616 in FIGS. 38 and 39, respectively) has two flanking sense BPBs 626 (corresponding to 608 and 618 in FIGS. 38 and 39, respectively). Each of the bond pads on the interposer 622 for sense BPBs 626 is electrically coupled to a respective probe pad 628. The BPB under test 624 in this example is electrically coupled to two probe pads 628, although only one or more probe pads may be used. In this example, the electrical coupling between the bond pads and the probe pads 628 are by a connection through the top metallization layer, e.g., one of the portions 630 of the third metallization layer 158, but the coupling may be through various other metallization layers. The bond pads on the die 620 for the BPB under test 624 and the sense BPBs 626 are electrically coupled together through connections by the portions 632 in the top metallization layer of the die 620, although various combinations of other metallization layers may be used. In this example, the connection of the bond pad for the BPB under test 624 to the portion 632 of the top metallization layer of the die is intermediate the connections of the bond pads for the sense BPBs 626 to the portion 632 of the top metallization layer.

The structure in FIG. 40 may be tested after attaching the die 620 but before, for example, back side processing. The probe pad 628 of one of the sense BPBs 626 and one of the probe pads 628 of the BPB under test 624 are used to apply a current through the BPB under test 624. The probe pad 628 of the other sense BPBs 626 and the other probe pad 628 of the BPB under test 624 are used to measure a voltage drop across the BPB under test 624. Using the applied current and measured voltage drop, the resistance of the BPB under test 624 may be calculated, and whether the BPB under test 624 forms an electrical connection may be determined.

Figure 41:
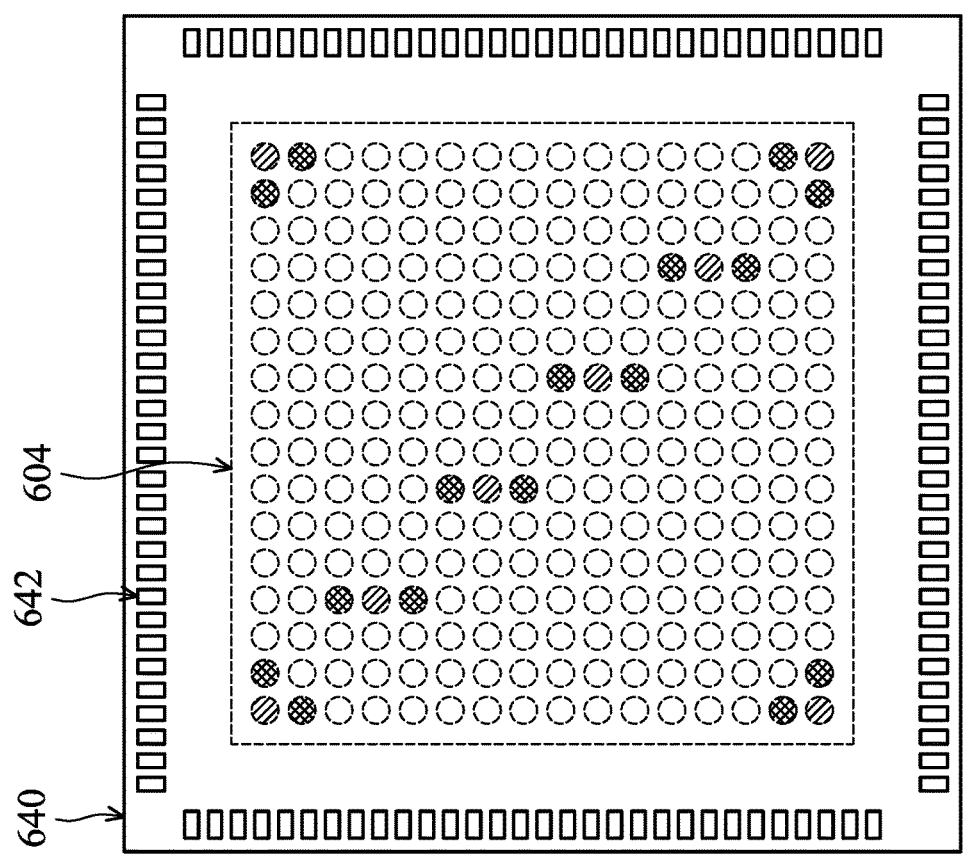
FIG. 41 is a back side pattern of an interposer according to an embodiment.
Figure 42:
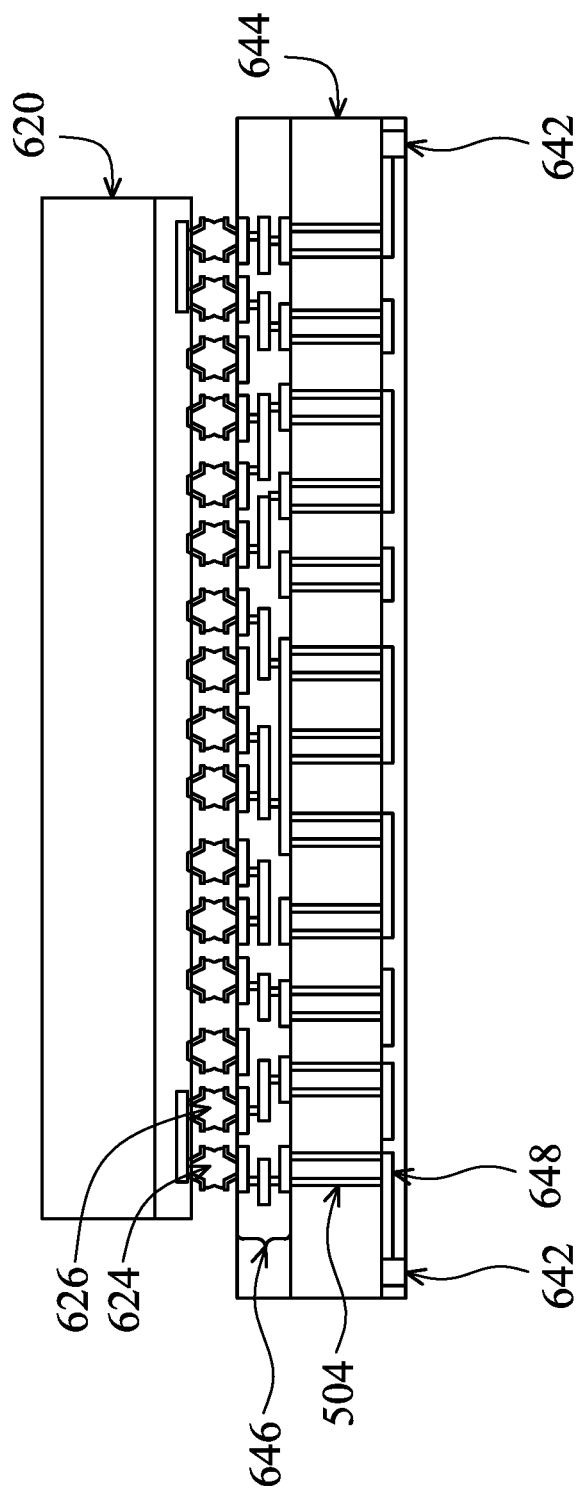
FIG. 42 is a cross section view of a die having an active surface of FIG. 39 attached to an interposer having a back side pattern of FIG. 41 according to an embodiment.

FIGS. 41 and 42 illustrate a modification to the structure in FIGS. 38 through 40. FIG. 41 shows a back side pattern 640 of an interposer with the pattern of the die-attach area 604 of the front side shown in phantom. The back side pattern 640 includes probe pads 642 along a periphery of the interposer.

FIG. 42 shows a cross section similar to FIG. 40. The structure is processed through the die attach step and formation of a back side metallization layer, such as after forming a metallization layer in FIG. 2F but before forming balls in FIG. 2G. The interposer 644 in FIG. 42 includes interconnect structures 646 formed from portions of the first, second, and third metallization layers 154, 156, and 158, respectively, and vias formed therebetween. The interposer 644 further includes TSVs 504 between the interconnect structures 646 and portions 648 of a back side metallization layer. The portions 648 electrically couple each TSV 504 to a respective probe pad 642. In this example, the probe pads 642 are aluminum copper, and the portions 648 are copper, although other materials previously discussed may be used.

As with above, each of the bond pads on the interposer 644 for sense BPBs 626 is electrically coupled to a respective probe pad 642, and the BPB under test 624 in this example is electrically coupled to two probe pads 642. In this example, the electrical coupling between the bond pads of the interposer 644 and the probe pads 642 are by a connection through an interconnect structure 646, a TSV 504, and a portion 648 of the back side metallization layer. The bond pads on the die 620 and respective connections are the same as previously discussed with respect to FIG. 40.

Similar to FIG. 40, the structure in FIG. 42 may be tested after forming a back side metallization layer but before, for example, the formation of conductive balls. The probe pad 642 of one of the sense BPBs 626 and one of the probe pads 642 of the BPB under test 624 are used to apply a current through the BPB under test 624. The probe pad 642 of the other sense BPBs 626 and the other probe pad 642 of the BPB under test 624 are used to measure a voltage drop across the BPB under test 624. Using the applied current and measured voltage drop, the resistance of the BPB under test 624 may be calculated, and whether the BPB under test 624 forms an electrical connection may be determined.

Figure 43:
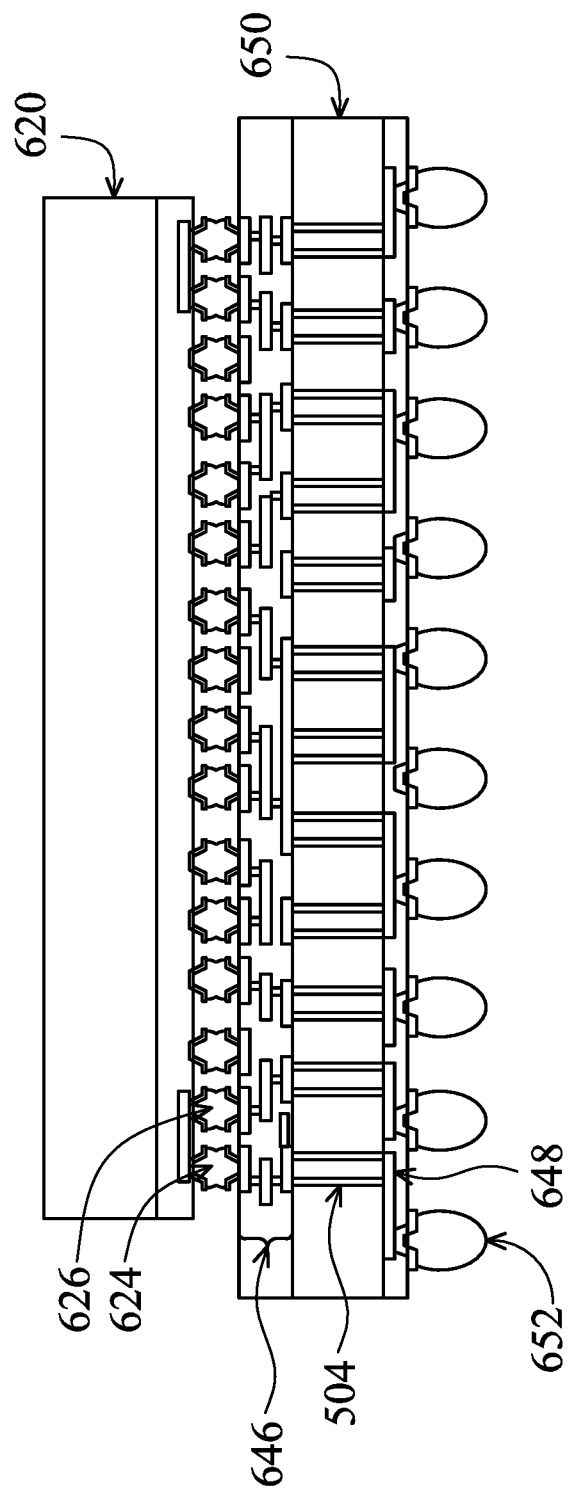
FIG. 43 is a cross section view of a die having an active surface of FIG. 39 attached to an interposer according to an embodiment.

FIG. 43 is a modification of FIG. 42. Instead of the portions 648 of the back side metallization layer electrically coupling the probe pads 642 to the TSVs 504, the portions 648 electrically couple the TSVs 504 to ball structures 652, which include ball bond pads, of the back side of the interposer 650. In other embodiments, the ball bond pads may be directly connected to the TSVs 504 without the presence of a back side metallization layer. The testing of the BPB under test 624 may be performed similarly as discussed with respect to FIG. 42, except the ball structures 652 are probed to apply a current and measure a voltage instead of the probe pads 642.

Figure 44:
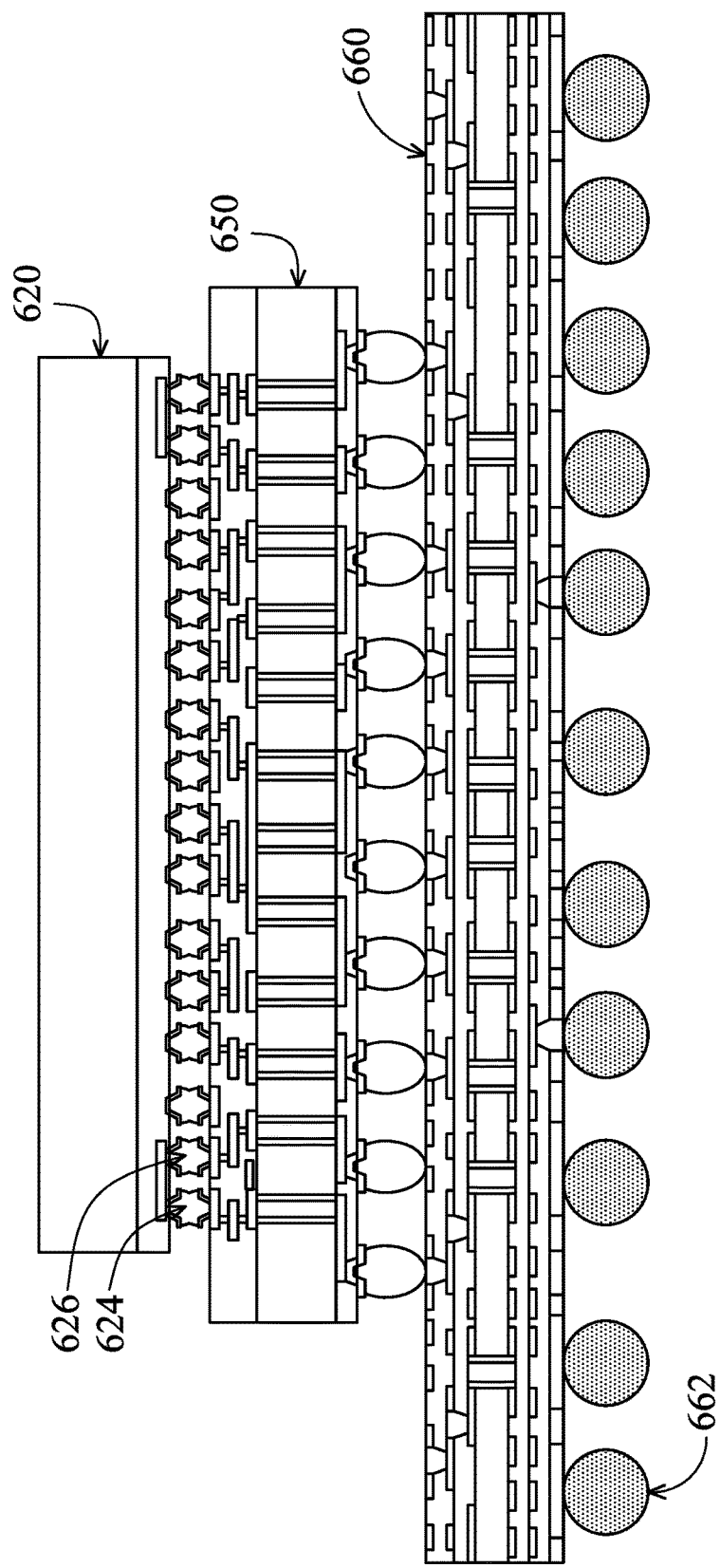
FIG. 44 is a cross section view of a die having an active surface of FIG. 39 attached to an interposer attached to a substrate according to an embodiment.

FIG. 44 is a modification of FIG. 43. The structure in FIG. 44 is the same as or similar to the structure in FIG. 43 with the addition of a substrate 660 attached to the interposer 650. The substrate 660 includes ball grid array (BGA) ball structures 662. The testing may be performed similar to that of FIG. 43, except the BGA ball structures 662 are probed instead of the ball structures 652 of the interposer 650.

Figure 45:
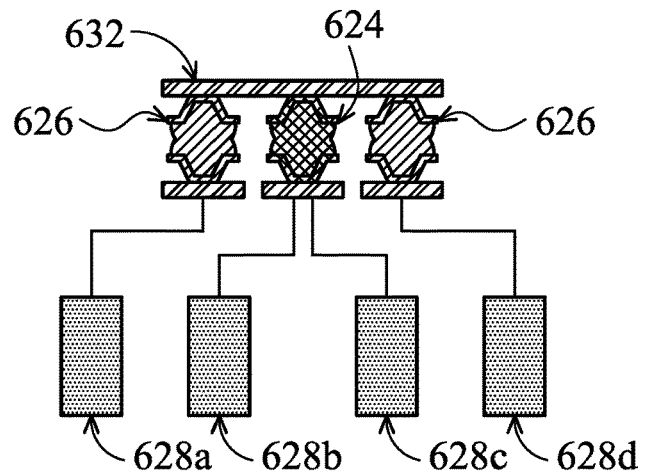
FIGS. 45 through 48 are general concepts of testing a bump pad and/or bump (BPB) under test according to various embodiments.
Figure 46:
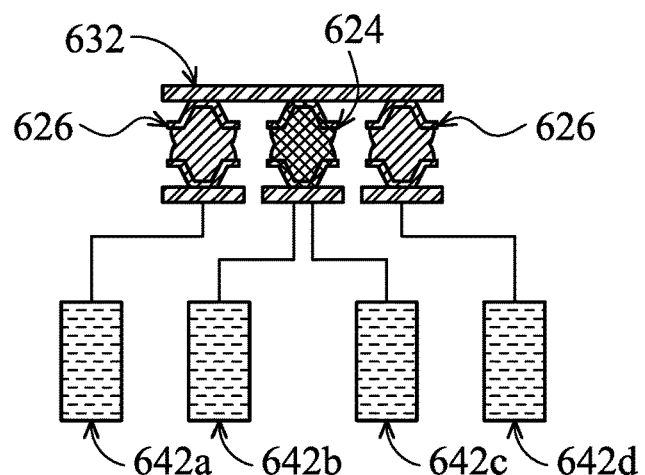
Figure 47:
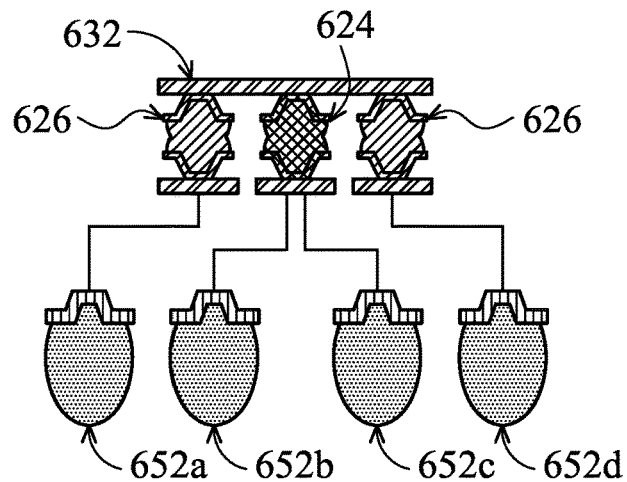
Figure 48:
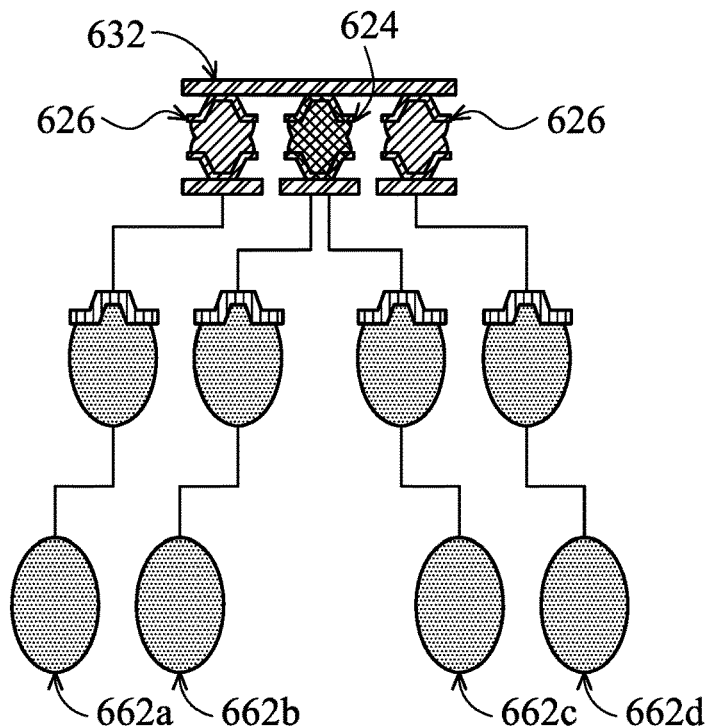

FIGS. 45 through 48 show general concepts of testing the BPB under test 624 discussed with respect to FIGS. 38 through 44. FIG. 45 generally corresponds to the structure in FIG. 40. In testing, a current is applied through probe pads 628a and 628b, and a voltage is sensed through probe pads 628c and 628d. FIG. 46 generally corresponds to the structure in FIG. 42. Again, in testing, a current is applied through probe pads 642a and 642b, and a voltage is sensed through probe pads 642c and 642d. FIGS. 47 and 48 generally correspond to FIGS. 43 and 44, respectively. In testing, a current is applied through ball structures 652a and 652b or BGA ball structures 662a and 662b, and a voltage is sensed through ball structures 652c and 652d or BGA ball structures 662c and 662d.

Figure 49:
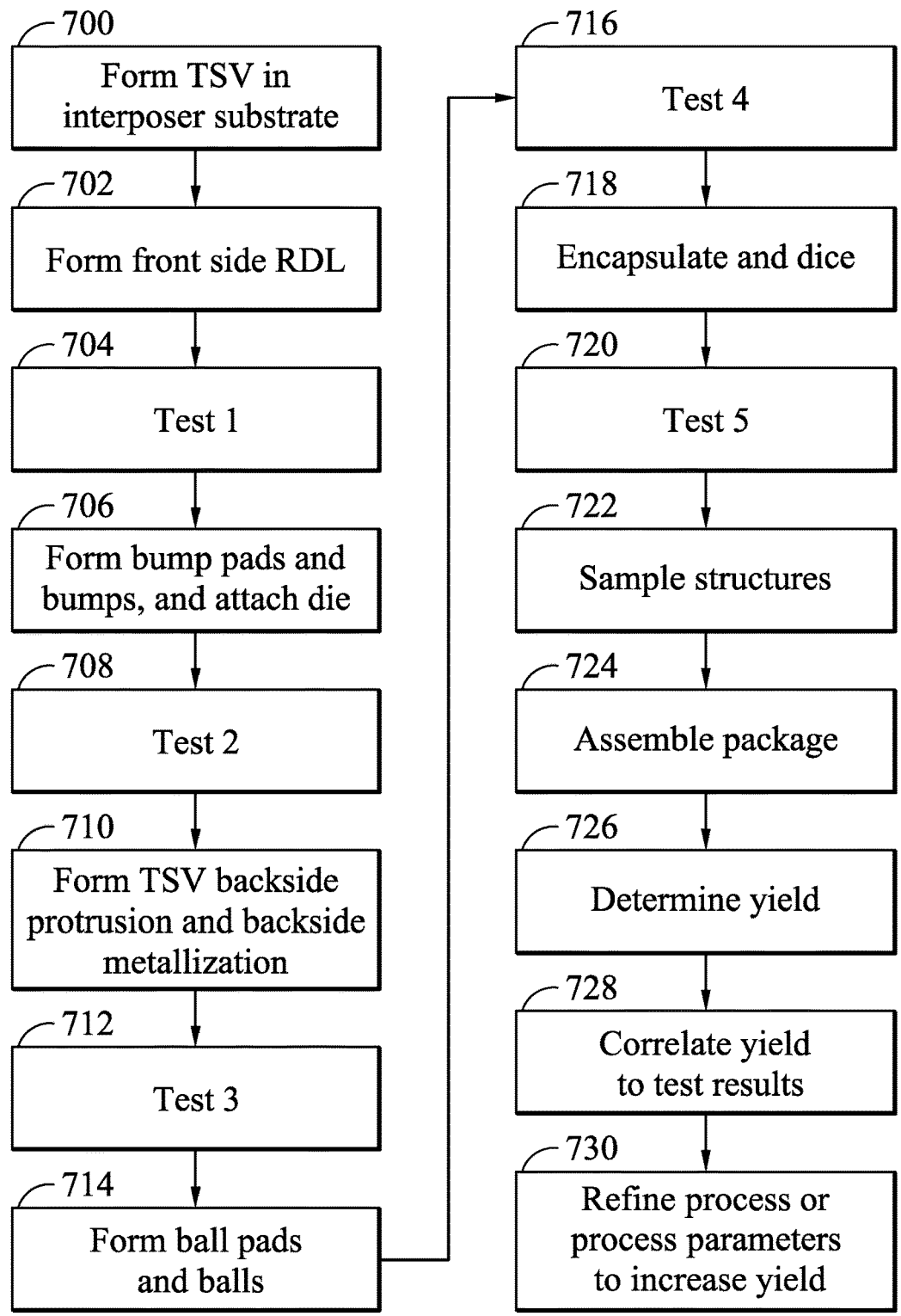
FIG. 49 illustrates a method for forming a die attached to an interposer and for testing structures of the interposer and/or die according to an embodiment.

FIG. 49 illustrates a method for forming a die attached to an interposer and for testing structures of the interposer and/or die. In step 700, a TSV is formed in an interposer substrate, such as shown in FIG. 2A. In step 702, a front side RDL is formed, such as in FIG. 2B. In step 704, a first test or set of tests is performed, such as the general testing discussed with regard to FIGS. 20, 21, 27, and 28. It should be noted that some of these tests may be performed during the formation of the front side RDL, such as between the formations of various metallization layers. In step 706, bump pads and/or bumps are formed on the front side of the interposer, and a die is attached to the interposer, such as shown in FIGS. 2C and 2D or FIGS. 3D and 3E. In step 708, a second test or set of tests is performed, such as the general testing discussed with regard to FIG. 45.

In step 710, a TSV back side protrusion is formed, and a back side metallization may be formed, such as shown in FIGS. 2F or 3B. In step 712, a third test or set of tests is performed, such as the general testing discussed with regard to FIGS. 35, 36, and 46. In step 714, ball pads and balls are formed on the back side of the interposer, such as shown in FIGS. 2G and 3C. In step 716, a fourth test or set of tests is performed, such as the general testing discussed with regard to FIGS. 37 and 47.

In step 718, the interposer and die are diced, such as shown in FIGS. 2H and 3F. In step 720, a fifth test or set of tests is performed, such as the general testing discussed with regard to FIGS. 37 and 47. In step 722, the diced structures are sampled by performing testing, as is known in the art. In step 724, a package is assembled by attaching the interposer to a substrate. In step 726, a yield is determined by methods known in the art. In step 728, the test results are correlated to the determined yield to identify a processing step that causes defects that reduces the yield. In step 730, based on the correlation, a process or process parameter is refined to increase the yield of the entire process.

By using the test structures and testing methods discussed above, known good interposers and dies may be more readily identified during processing, which may allow focusing processing on the known good interposers/dies. This may increase the cost efficiency of processing, such as by not using time or materials on known defective interposers/dies. Further, by identifying process steps that generate defects, the process may be refined in a manner that increases the yield.

A first embodiment is a structure comprising an interposer. The interposer has a test structure extending along a periphery of the interposer, and at least a portion of the test structure is in a first redistribution element. The first redistribution element is on a first surface of a substrate of the interposer. The test structure is intermediate and electrically coupled to at least two probe pads.

Another embodiment is a structure comprising an interposer, a die, conductive bumps, a test structure, and at least two electrical terminations. The conductive bumps electrically couple the die to the interposer. The test structure comprises at least one of the conductive bumps. The at least two electrical terminations are on the interposer, and the test structure is intermediate and electrically coupled to the at least two electrical terminations.

A further embodiment is a method comprising forming a dummy test structure, the dummy test structure being at least partially in an interposer; applying a test signal to the dummy test structure; and sensing a response of the dummy test structure to the test signal.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a substrate, the substrate having a plurality of through vias arranged along a periphery of the substrate;
   a first redistribution structure along on a first side of the substrate, the first redistribution structure having first links electrically coupling adjacent pairs of the plurality of through vias; and
   a second redistribution structure along a second side of the substrate, the substrate being interposed between the first redistribution structure and the second redistribution structure, the second redistribution structure having second links electrically coupling adjacent through vias of adjacent ones of the adjacent pairs of through vias, the first links and the second links forming a through via daisy chain, the second redistribution structure having a first probe pad and a second probe pad electrically coupled to the through via daisy chain.

2. The device of claim 1, wherein the first redistribution structure comprises:
   a first insulating layer;
   a first interconnect in the first insulating layer;
   a second insulating layer over the first insulating layer;
   a second interconnect in the second insulating layer; and
   a plurality of vias interconnecting the first interconnect and the second interconnect.

3. The device of claim 1, further comprising a first seal ring extending along the periphery of the substrate, the first seal ring interposed between the plurality of through vias and an edge of the substrate.

4. The device of claim 3, further comprising a second seal ring extending along the periphery of the substrate, the second seal ring being interposed between the first seal ring and the plurality of through vias.

5. The device of claim 4, wherein the first redistribution structure comprises the first seal ring and the second seal ring.

6. The device of claim 1, further comprising probe pads electrically coupled to the through via daisy chain.

7. The device of claim 6, wherein the probe pads are disposed on the second side of the substrate.

8. The device of claim 7, wherein the probe pads are disposed in corners of the substrate.

9. A device comprising:
   a substrate, the substrate having a plurality of through vias arranged along a periphery of the substrate, the plurality of through vias comprising a first through via, a second through via, a third through via, and a fourth through via, the second through via being adjacent the first through via and the third through via, the third through via being adjacent the second through via and the fourth through via;
   a first redistribution structure along on a first side of the substrate, the first redistribution structure having first conductive structure and a second conductive structure, the first conductive structure electrically interposed between the first through via and the second through via, the second conductive structure electrically interposed between the third through via and the fourth through via; and
   a second redistribution structure along a second side of the substrate, the substrate being interposed between the first redistribution structure and the second redistribution structure, the second redistribution structure having a third conductive structure electrically interposed between the second through via and the third through via, the second redistribution structure comprising a first probe pad and a second probe pad, the first through via, the second through via, the third through via, and the fourth through via being electrically interposed between the first probe pad and the second probe pad.

10. The device of claim 9, wherein the first probe pad is in a first corner of the substrate, the second probe pad is in a second corner of the substrate, the first corner being a different corner of the substrate than the second corner.

11. The device of claim 9, wherein the first conductive structure comprises a first interconnect in a first insulating layer, a second interconnect in a second insulating layer, and a via interconnecting the first interconnect and the second interconnect.

12. The device of claim 11, further comprising one or more additional vias interconnecting the first interconnect and the second interconnect.

13. The device of claim 9, further comprising one or more seal rings interposed between the plurality of through vias and an edge of the substrate in a plan view.

14. The device of claim 13, wherein the one or more seal rings are in the first redistribution structure.

15. A device comprising:
 a substrate, the substrate having a plurality of through vias arranged along a periphery of the substrate, the plurality of through vias comprising a first through via and a second through via;
 a first redistribution structure along on a first side of the substrate, the first redistribution structure having a first probe pad electrically coupled to the first through via and a second probe pad electrically coupled to the second through via; and
 a second redistribution structure along a second side of the substrate, wherein the plurality of through vias are electrically coupled in a through via daisy chain between the first probe pad and the second probe pad.

16. The device of claim 15, wherein the second redistribution structure comprises a plurality of metallization layers, conductive portions in adjacent ones of the plurality of metallization layers being electrically coupled by one or more vias, the conductive portions electrically interposed between the first through via and the second through via.

17. The device of claim 15, wherein the first probe pad is disposed at a first corner of the substrate, the second probe pad being disposed at a second corner of the substrate, the through via daisy chain being free of other probe pads between the first corner and the second corner.

18. The device of claim 15, wherein the first through via has a diameter of about 12 micrometers.

19. The device of claim 15, wherein the first through via overlaps over a border of an isolation area of the substrate.

20. The device of claim 15, further comprising one or more seal rings interposed between the through via daisy chain and an edge of the substrate.

* * * * *